United States Patent
Facchetti et al.

(10) Patent No.: US 11,882,710 B2
(45) Date of Patent: Jan. 23, 2024

(54) THIN-FILM TRANSISTOR COMPRISING ORGANIC SEMICONDUCTOR MATERIALS

(71) Applicant: Flexterra, Inc., Skokie, IL (US)

(72) Inventors: Antonio Facchetti, Skokie, IL (US); Yu Xia, Skokie, IL (US); Zhihua Chen, Skokie, IL (US); Timothy Chiu, Skokieil, IL (US); Shaofeng Lu, Skokie, IL (US)

(73) Assignee: Flexterra, Inc., Skokie, IL (US)

( * ) Notice: Subject to any disclaimer, the term of this patent is extended or adjusted under 35 U.S.C. 154(b) by 0 days.

(21) Appl. No.: 17/275,547

(22) PCT Filed: Nov. 19, 2019

(86) PCT No.: PCT/US2019/062247
§ 371 (c)(1),
(2) Date: Mar. 11, 2021

(87) PCT Pub. No.: WO2020/106742
PCT Pub. Date: May 28, 2020

(65) Prior Publication Data
US 2021/0257568 A1 Aug. 19, 2021

Related U.S. Application Data

(60) Provisional application No. 62/769,756, filed on Nov. 20, 2018.

(30) Foreign Application Priority Data

Dec. 6, 2018 (EP) ..................................... 18210830

(51) Int. Cl.
*H10K 10/46* (2023.01)
*H10K 85/60* (2023.01)

(52) U.S. Cl.
CPC ......... *H10K 10/484* (2023.02); *H10K 10/471* (2023.02); *H10K 85/621* (2023.02)

(58) Field of Classification Search
CPC .................................................. H01L 51/0558
See application file for complete search history.

(56) References Cited

U.S. PATENT DOCUMENTS

| | | | |
|---|---|---|---|
| 4,990,977 A * | 2/1991 | Hack | H01L 29/78642 257/60 |
| 10,615,233 B2 | 4/2020 | Muccini et al. | |

(Continued)

FOREIGN PATENT DOCUMENTS

| | | |
|---|---|---|
| WO | 2009/098252 | 8/2009 |
| WO | 2012/090110 | 7/2012 |
| WO | 2016/027217 | 2/2016 |

OTHER PUBLICATIONS

Written Opinion and International Search Report dated Apr. 14, 2020 for International Application No. PCT/US2019/062247, 9 pages.

(Continued)

*Primary Examiner* — William D Young
(74) *Attorney, Agent, or Firm* — McDonnell Boehnen Hulbert & Berghoff LLP

(57) ABSTRACT

This invention relates to a thin-film transistor including, a dielectric layer having a first side and an opposed second side; a source electrode, a drain electrode separated from the source electrode, and a semiconductor component disposed between and in contact with the source electrode and the drain electrode, the source electrode, the drain electrode and the semiconductor component being disposed adjacent the first side of the dielectric layer; and a gate electrode disposed adjacent the second side of the dielectric layer opposite the semiconductor component; wherein the semiconductor component comprises one or more n-type organic semiconductor (Continued)

materials based on arene-bis(dicarboximide)s, and wherein the thin-film transistor has a channel length, measured as the shortest path from the source electrode to the drain electrode, of no more than 20 μm.

22 Claims, 17 Drawing Sheets

(56) References Cited

U.S. PATENT DOCUMENTS

| | | | | |
|---|---|---|---|---|
| 2005/0057136 | A1* | 3/2005 | Moriya | H01L 51/0545 313/504 |
| 2010/0319778 | A1* | 12/2010 | Kastler | C09B 5/62 136/263 |
| 2017/0250347 | A1* | 8/2017 | Vladimirov | H01L 51/0004 |

OTHER PUBLICATIONS

Vladimirov et al., "High-Mobility, Ultrathin Organic Semiconducting Films Realized by Surface-Mediated Crystallization", Nano Letters, vol. 18, No. 1, Oct. 10, 2017, pp. 9-14.

Yoo et al, "High-mobility bottom-contact n-channel organic transistors and their use in complementary ring oscillators", Applied Physics Letters, A I P Publishing LLC, US, vol. 88, No. 8, Feb. 22, 2006, pp. 82104-082104-3.

Jung et al., "Nanoscale n-channel and ambipolar organic field-effect transistors", Applied Physics Letters, A I P Publisheding LLC, US, vol. 88, No. 18, May 1, 2006, pp. 183102-183102-3.

Kanicki et al., "Performance of thin hydrogenated amorphous silicon thin-film transistors." J. Appl. Phys. 69, 2339 (1991).

Gundlach et al., "An experimental study of contact effects in organic thin film transistors." J. Appl. Phys. 100, 024509 (2006).

Chen et al., "Scaling down of organic thin film transistors: short channel effects and channel length-dependent field effect mobility." J. Mater. Sci 44:280-284 (2009).

Facchetti, "Semiconductors for organic transistors", Materialstoday,10(3):28-37 (2007).

Hayawaka, "Dinaphthothiepine Bisimide and Its Sulfoxide: Soluble Precursors for Perylene Bisimide", Journal of the American Chemical Society, 142(27):11663-11668 (2020).

* cited by examiner

Device B-2 | Device B-2

Device D-3-Cu · Device D-3-Cu

Device E-2-Grav  Device E-2-Grav

THIN-FILM TRANSISTOR COMPRISING ORGANIC SEMICONDUCTOR MATERIALS

CROSS-REFERENCE TO RELATED APPLICATIONS

This application is a U.S. National Stage application of International Patent Application no. PCT/US2019/062247, filed Nov. 19, 2019, which claims the benefit of priority of U.S. Provisional Patent Application No. 62/769,756, filed Nov. 20, 2018, and European pat. app. 18210830.8, filed Dec. 6, 2018, each of which is hereby incorporated herein by reference in its entirety.

FIELD OF THE INVENTION

This invention relates generally to the field of organic semiconductor materials and devices including them. More particularly, the present invention relates to thin-film transistors comprising n-type organic semiconductor materials based on arene-bis(dicarboximide)s.

TECHNICAL BACKGROUND

Electronic devices using organic semiconductors as a component of the charge-carrying layer can offer advantages such as mechanical flexibility, lower manufacturing costs, and low-temperature ambient manufacturing processes using printing methodologies. Such advantages enable devices including electronic paper, flexible organic light-emitting diodes (OLEDs), radio-frequency identification (RFID) technologies, solar cells, light-emitting transistors (OLETs), and sensors. Key to these technologies are thin-film transistors (TFTs), or more specifically, field-effect transistors based on organic semiconductors (OFETs), in which semiconductors function as a current modulator and switcher when using two independent electrical potentials.

Current efforts to develop thin-film transistors based on electron-transporting (n-type) organic semiconductor materials have been hampered by chemical instability and/or poor device performance. Particularly, conventional n-type organic semiconductor materials are vulnerable to ambient conditions (e.g., air) and solution-processing, preventing, for example, formulation of the materials into inks for inexpensive printing processes. Accordingly, TFTs including such materials are expensive, inefficient, and/or ineffective. Additionally, miniaturization of TFTs comprising conventional n-type organic semiconductor materials is currently limited by contact resistance, which limits carrier mobility when the transistor channel length is reduced.

Accordingly, there remains a need for a robust n-type organic semiconductor material that is processable in common solvents. There further remains a need for an n-type organic semiconductor material having a high carrier mobility in short-channel transistors.

SUMMARY OF THE INVENTION

In one aspect, the invention provides a thin-film transistor comprising a dielectric layer having a first side and a second side opposed to said first side;

a source electrode, a drain electrode separated from the source electrode, and a semiconductor component disposed between and in contact with the source electrode and the drain electrode, the source electrode, the drain electrode and the semiconductor component being disposed adjacent the first side of the dielectric layer; and a gate electrode disposed adjacent the second side of the dielectric layer, opposite the semiconductor component;

wherein the semiconductor component comprises one or more compounds selected from the group consisting of:

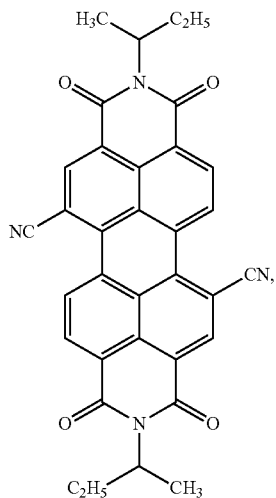

1A

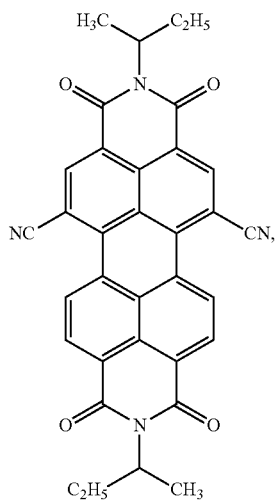

1B

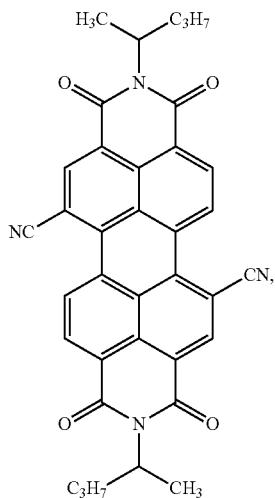

2A

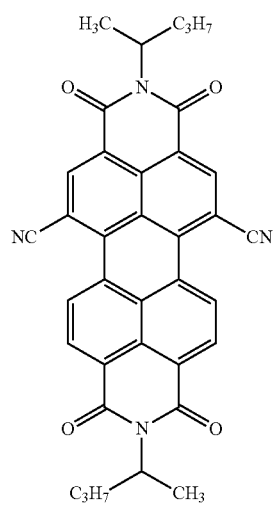

2B

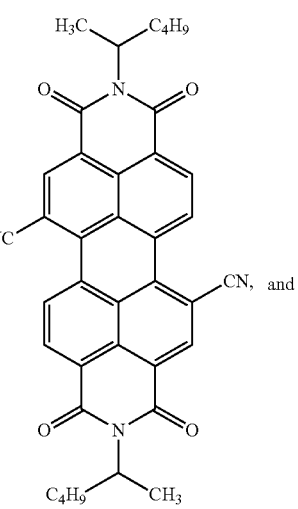

3A

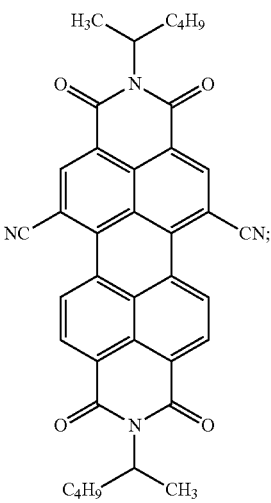

3B wherein the thin-film transistor has a channel length measured as the shortest path from the source electrode to the drain electrode, the channel length being no more than 20 μm.

Other aspects of the invention will be apparent to the person of ordinary skill in the art in view of the disclosure herein.

DETAILED DESCRIPTION

Figure 1:
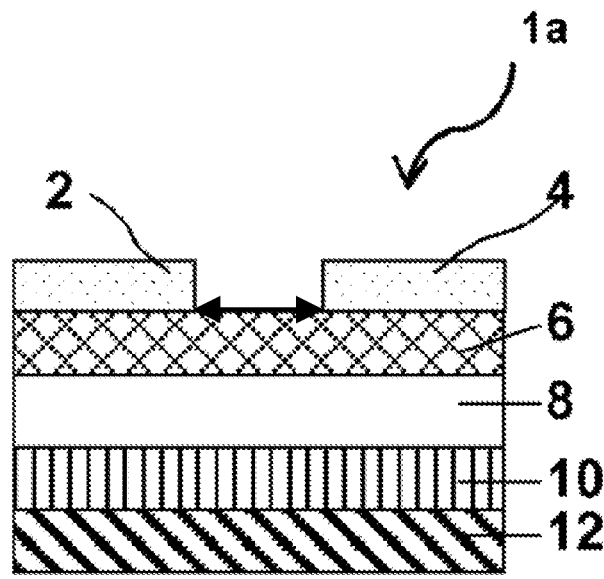
FIG. 1 is a schematic cross-sectional view of a thin-film transistor having a bottom-gate top-contact configuration, according to one embodiment of the invention.

The particulars shown herein are by way of example and for purposes of illustrative discussion of the preferred embodiments of the present invention only and are presented in the cause of providing what is believed to be the most useful and readily understood description of the principles and conceptual aspects of various embodiments of the invention. In this regard, no attempt is made to show structural details of the invention in more detail than is necessary for the fundamental understanding of the invention, the description taken with the drawings and/or examples making apparent to those skilled in the art how the several forms of the invention may be embodied in practice. Thus, before the disclosed processes and devices are described, it is to be understood that the aspects described herein are not limited to specific embodiments, apparatuses, or configurations, and as such can, of course, vary. It is also to be understood that the terminology used herein is for the purpose of describing particular aspects only and, unless specifically defined herein, is not intended to be limiting.

The terms "a," "an," "the" and similar referents used in the context of describing the invention (especially in the context of the following claims) are to be construed to cover both the singular and the plural, unless otherwise indicated herein or clearly contradicted by context. Recitation of ranges of values herein is merely intended to serve as a shorthand method of referring individually to each separate value falling within the range. Unless otherwise indicated herein, each individual value is incorporated into the specification as if it were individually recited herein. Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

All methods described herein can be performed in any suitable order of steps unless otherwise indicated herein or otherwise clearly contradicted by context. The use of any and all examples, or exemplary language (e.g., "such as") provided herein is intended merely to better illuminate the invention and does not pose a limitation on the scope of the invention otherwise claimed. No language in the specification should be construed as indicating any non-claimed element essential to the practice of the invention.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to". Words using the singular or plural number also include the plural and singular number, respectively. Additionally, the words "herein," "above," and "below" and words of similar import, when used in this application, shall refer to this application as a whole and not to any particular portions of the application.

As will be understood by one of ordinary skill in the art, each embodiment disclosed herein can comprise, consist essentially of or consist of its particular stated element, step, ingredient or component. As used herein, the transition term "comprise" or "comprises" means includes, but is not limited to, and allows for the inclusion of unspecified elements, steps, ingredients, or components, even in major amounts. The transitional phrase "consisting of" excludes any element, step, ingredient or component not specified. The transition phrase "consisting essentially of" limits the scope of the embodiment to the specified elements, steps, ingredients or components and to those that do not materially affect the embodiment.

Unless otherwise indicated, all numbers expressing quantities of ingredients, properties such as molecular weight, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. When further clarity is required, the term "about" has the meaning reasonably ascribed to it by a person skilled in the art when used in conjunction with a stated numerical value or range, i.e., denoting somewhat more or somewhat less than the stated value or range, to within the degree of precision typical in the art.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements.

Groupings of alternative elements or embodiments of the invention disclosed herein are not to be construed as limitations. Each group member may be referred to and claimed individually or in any combination with other members of the group or other elements found herein. It is anticipated that one or more members of a group may be included in, or deleted from, a group for reasons of convenience and/or patentability. When any such inclusion or deletion occurs, the specification is deemed to contain the group as modified thus fulfilling the written description of all Markush groups used in the appended claims.

Some embodiments of this invention are described herein, including the best mode known to the inventors for carrying out the invention. Of course, variations on these described embodiments will become apparent to those of ordinary skill in the art upon reading the foregoing description. The inventor expects skilled artisans to employ such variations as appropriate, and the inventors intend for the invention to be practiced otherwise than specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

Furthermore, numerous references have been made to patents and printed publications throughout this specification. Each of the cited references and printed publications are individually incorporated herein by reference in their entirety.

In closing, it is to be understood that the embodiments of the invention disclosed herein are illustrative of the principles of the present invention. Other modifications that may be employed are within the scope of the invention. Thus, by way of example, but not of limitation, alternative configurations of the present invention may be utilized in accordance with the teachings herein. Accordingly, the present invention is not limited to that precisely as shown and described.

The disclosure relates to n-type organic semiconductor materials of Formula I:

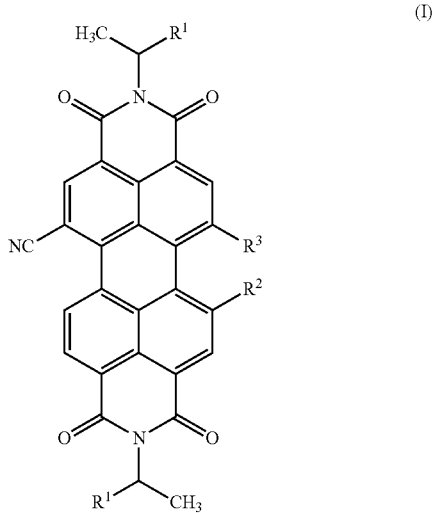

where
R$^1$ is —C$_2$H$_5$, —C$_3$H$_7$, or —C$_4$H$_9$; and
R$^2$ is —CN and R$^3$ is —H; or
R$^2$ is —H and R$^3$ is —CN.

The disclosure demonstrates that such materials are robust and solution-processable, and can exhibit unexpectedly high carrier mobility in a short-channel thin-film transistor.

As used herein, "solution-processable" or "solution-processed" refers to the ability of a material, for example, the present compounds, to be processed via various solution-phase processes (i.e., in which the material is dissolved in the solution). As used herein, a "p-type semiconductor material" or a "p-type semiconductor" refers to a semiconductor material having holes as the majority current carriers. As used herein, an "n-type semiconductor material" or an "n-type semiconductor" refers to a semiconductor material having electrons as the majority current carriers. As used herein, the term "carrier mobility" refers to the velocity at which charge carriers (e.g., holes or electrons) move through a material (e.g., a p-type semiconducting material or an n-type semiconducting material, respectively) under the influence of an electric field. When referencing field-effect devices, "carrier mobility" can be used interchangeably with "field-effect mobility."

Accordingly, one aspect of the invention is a thin-film transistor. An embodiment of such a thin-film transistor is shown in schematic cross-sectional view in FIG. 1. The transistor of FIG. 1 is configured as a field-effect transistor 1a of the bottom-gate top-contact structure type. Transistor 1a includes a dielectric layer 8 having a first side 18 and an opposed second side 28. Disposed adjacent (e.g., variously in contact with, or within 1 micron, 500 nm, or 200 nm of) the first side of the dielectric layer are semiconductor component 6 including an n-type organic semiconductor material according to Formula I, source electrode 2 and drain electrode 4. In the configuration of FIG. 1, the semiconductor component 6 is disposed against the dielectric layer 8, and the source electrode 2 and drain electrode 4 are disposed against the semiconductor component 6 opposite the dielectric layer 8; as will be seen below and as would be appreciated by the person of ordinary skill in the art, other configurations are possible. The semiconductor component 6 is disposed between and in contact with the source electrode 2 and the drain electrode 4. Gate electrode 10 is disposed adjacent the second side of the dielectric layer (e.g., in contact with, or within 1 micron, 500 nm, or 200 nm of the second side of the dielectric layer) opposite the semiconductor component. The thin-film transistor has a channel length measured in the semiconductor component as the shortest path from the source electrode to the drain electrode, indicated in FIG. 1 by the double-headed arrow. Notably, in especially desirable embodiments of the disclosure, the channel length is no more than 20 µm. As is common in thin-film semiconductor devices, the various components are disposed together on substrate 12.

Figure 2:
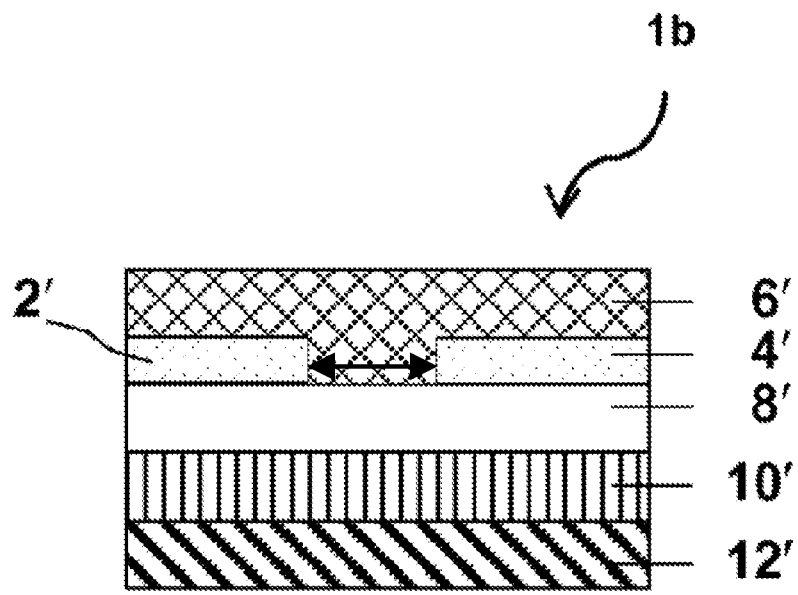
FIG. 2 is a schematic cross-sectional view of a thin-film transistor having a bottom-gate bottom-contact configuration, according to one embodiment of the invention.
Figure 3:
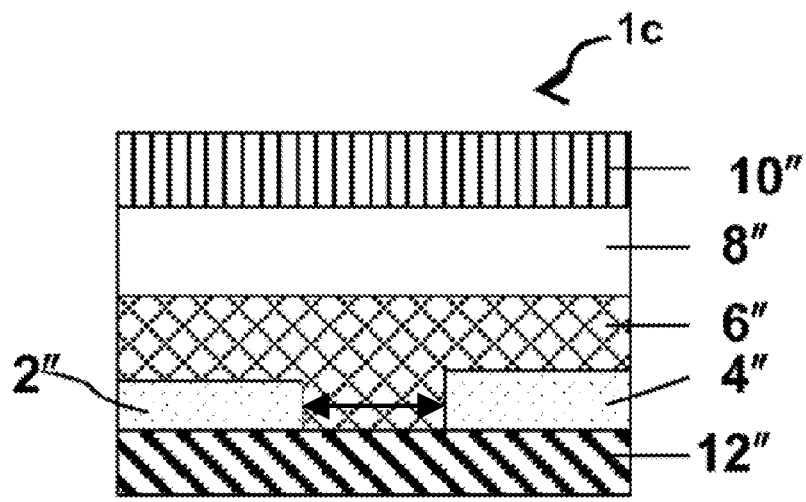
FIG. 3 is a schematic cross-sectional view of a thin-film transistor having a top-gate bottom-contact structure configuration, according to one embodiment of the invention.
Figure 4:
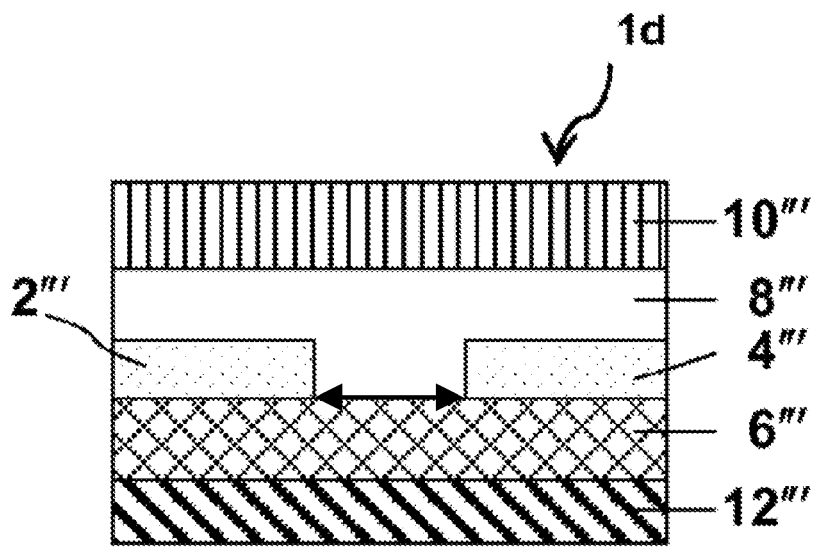
FIG. 4 is a schematic cross-sectional view of a thin-film transistor having a top-gate top-contact configuration, according to one embodiment of the invention.

FIGS. 2, 3 and 4 respectively illustrate three other common field-effect transistor structures, bottom-gate bottom-contact (1b), top-gate bottom-contact (1c) and top-gate top-contact (1d), each including a gate dielectric layer (8', 8", and 8'''), a semiconductor component (6', 6', and 6''') including an n-type organic semiconductor material according to Formula I, a gate electrode (10', 10", and 10'''), source electrodes (2', 2", and 2'''), drain electrodes (4', 4", and 4'''). In each of the configurations of FIGS. 2-4, the semiconductor component is in contact with the source and drain electrodes, and the gate dielectric component is in contact with the semiconductor component on one side and the gate electrode on an opposite side. The structures are supported by a substrate (12', 12", and 12'''). The channel length, desirably no more than 20 microns, is indicated in each Fig. by a double-headed arrow.

The person of ordinary skill in the art will appreciate that other components may be included in the thin-film transistors as otherwise described herein. For example, thin-film transistors having a top-gate configuration (e.g., of FIGS. 1 and 2) can include a blocking or passivation layer disposed against the gate electrode opposite the dielectric layer. In another example, thin-film transistors having a bottom-gate configuration (e.g., of FIGS. 3 and 4) can include a blocking or passivation layer disposed against the semiconductor component and/or the source and drain electrodes opposite the dielectric layer.

Figure 5:
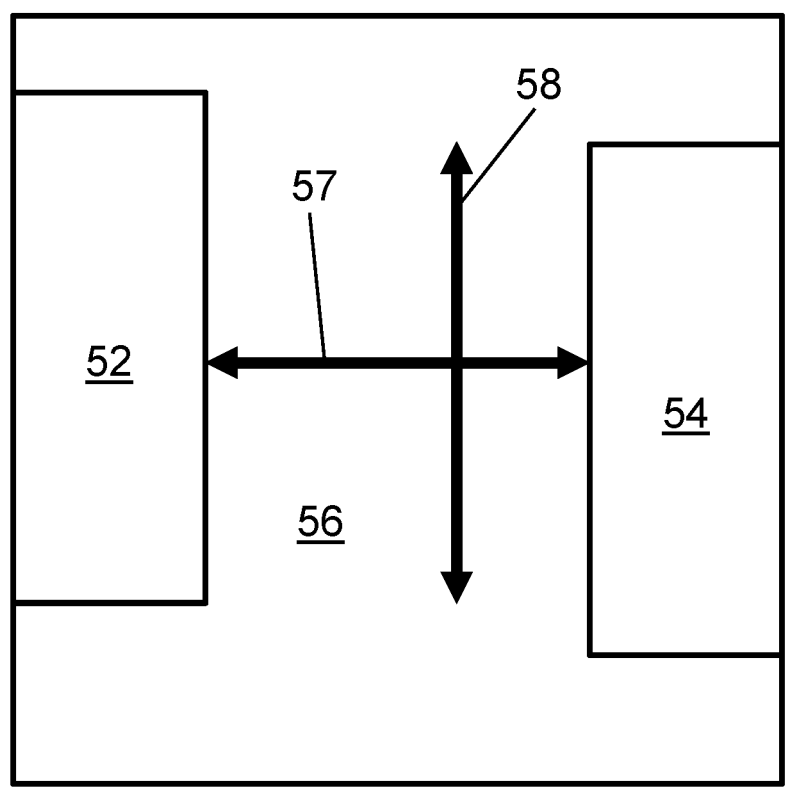
FIG. 5 is a partial schematic top-down view a thin-film transistor according to one embodiment of the invention.
Figure 6:
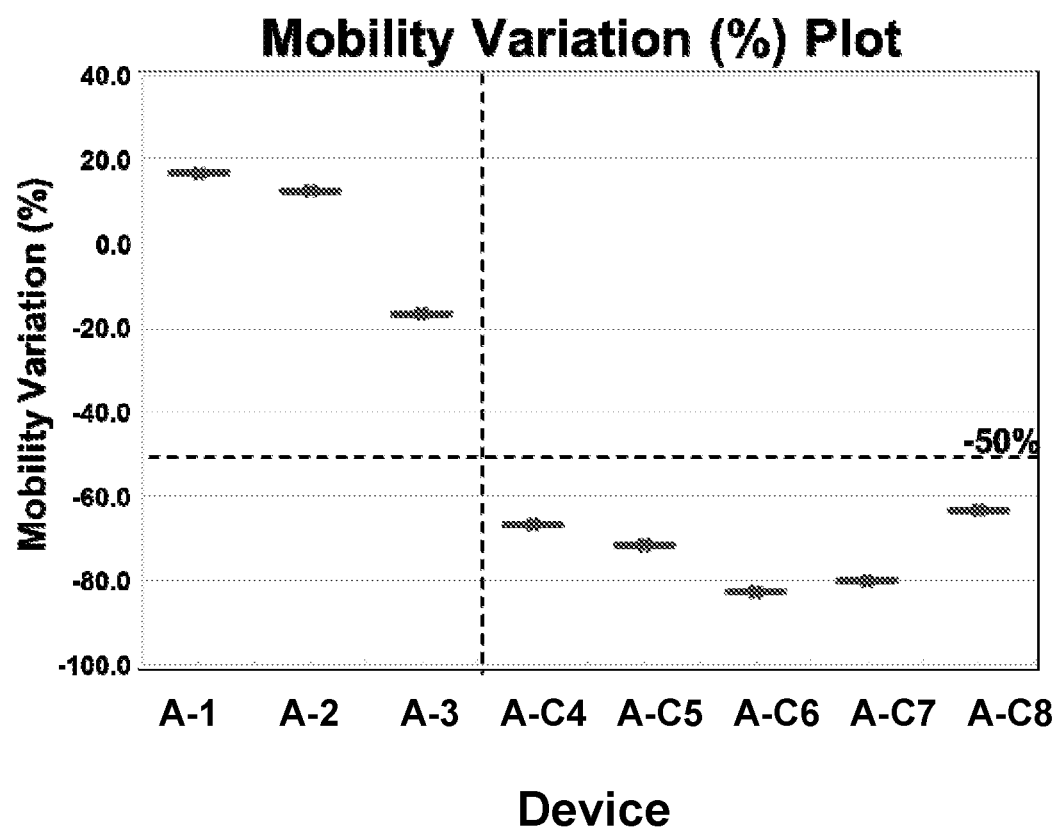
FIG. 6 is a graph showing the carrier mobility variation (i.e., the difference in carrier mobility between otherwise identical thin-film transistors having different channel lengths, expressed as a percentage change relative to the longer-channel transistor) between thin-film transistors having channel lengths of 50 μm and 10 μm comprising a variety of n-type organic semiconductor materials described herein.
Figure 7:
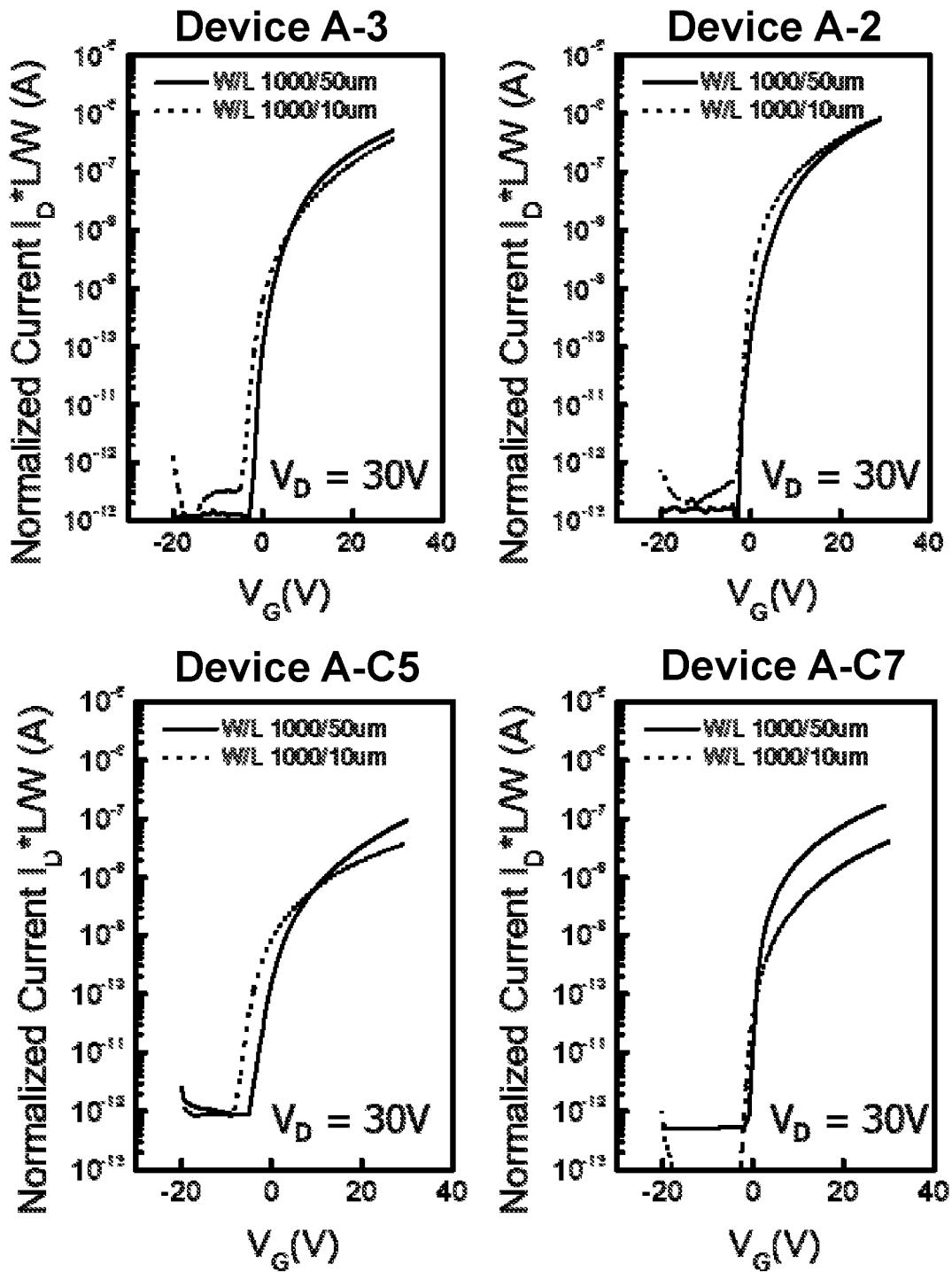
FIG. 7 is a set of graphs showing output characteristics for a variety of thin-film transistors described herein.
Figure 8:
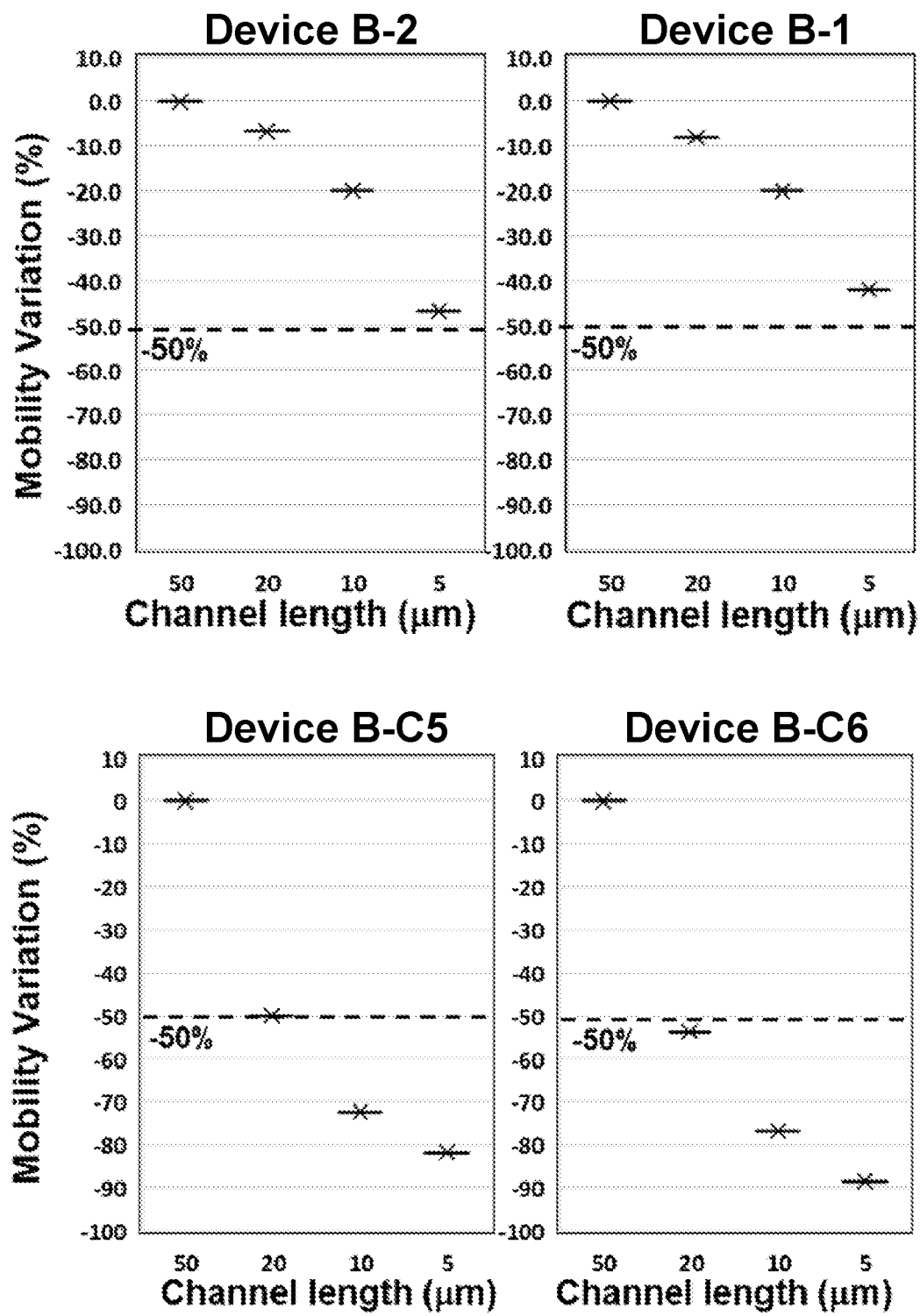
FIG. 8 is a set of graphs showing the carrier mobility variation between thin-film transistors having channel lengths of 50 μm and 20 μm, 10 μm, or 5 μm comprising a variety of n-type organic semiconductor materials described herein.
Figure 9:
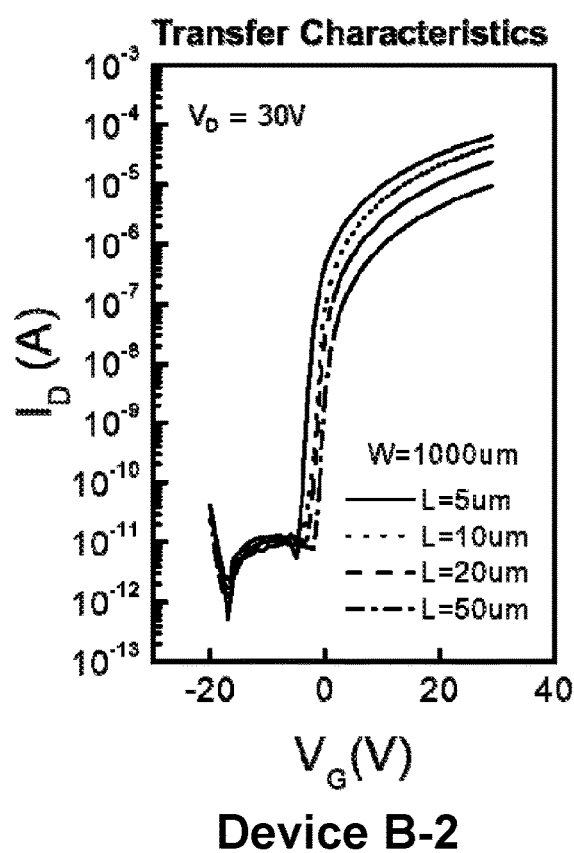
FIG. 9 is a set of graphs showing output characteristics for a thin-film transistor described herein.
Figure 9:
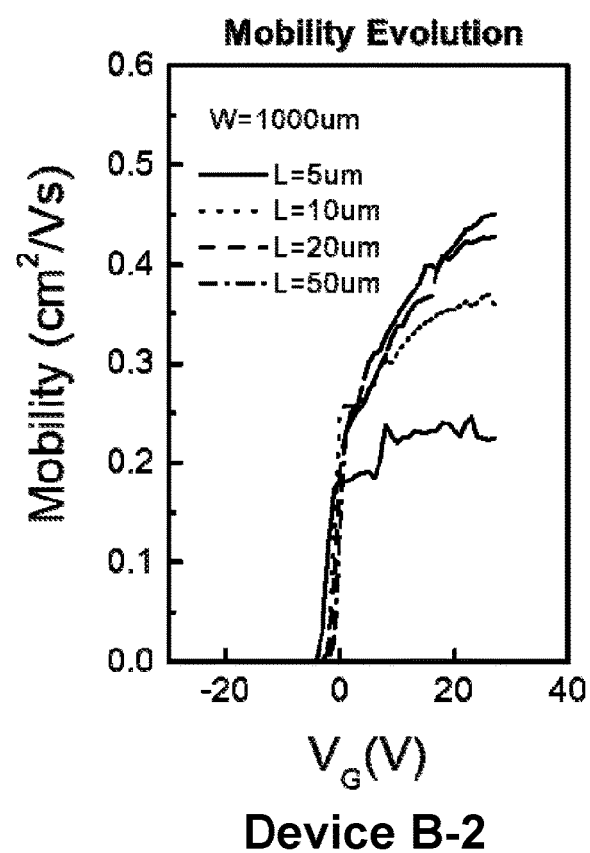
Figure 10:
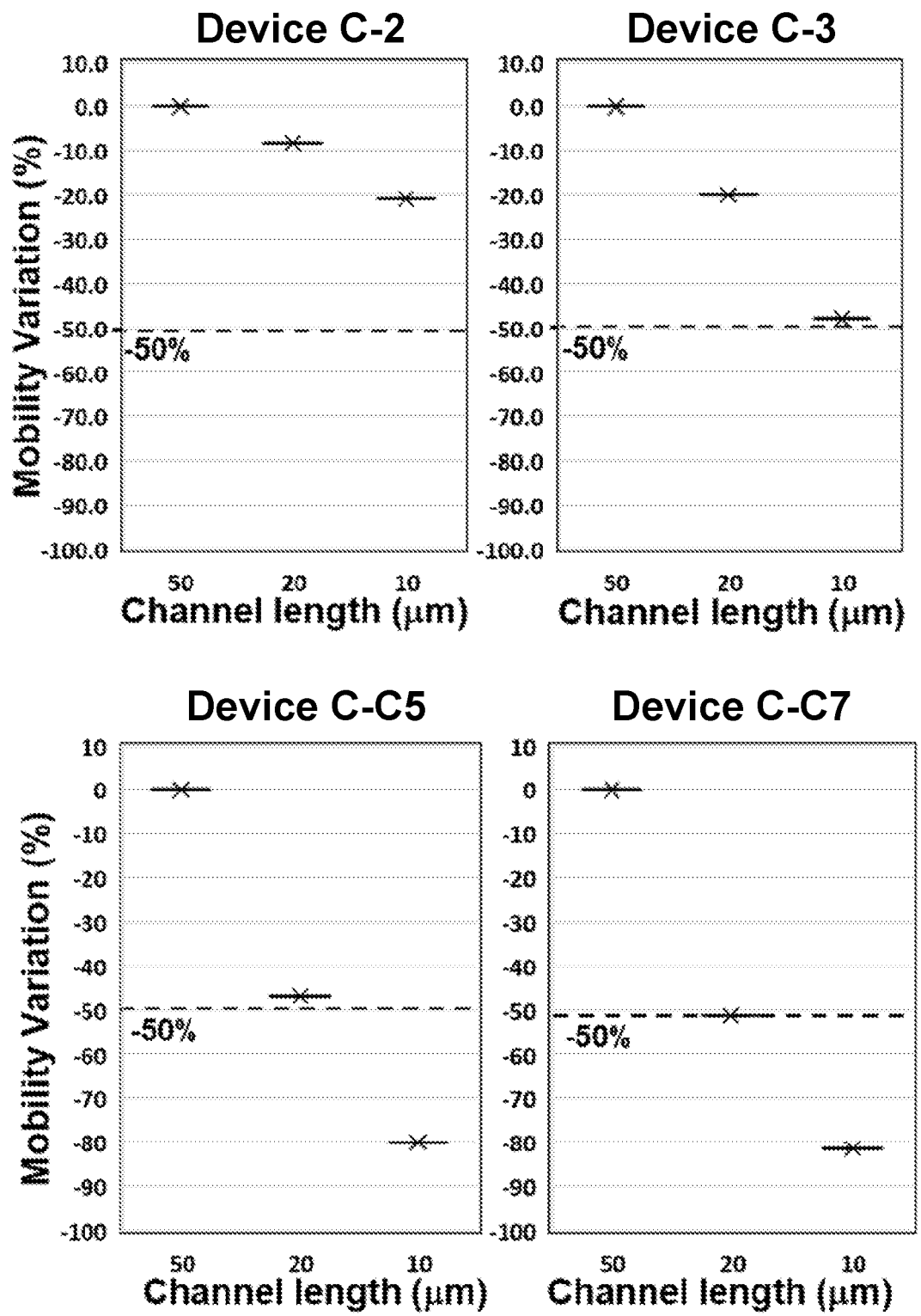
FIG. 10 is a set of graphs showing the carrier mobility variation between thin-film transistors having channel lengths of 50 μm and 20 μm or 10 μm comprising a variety of n-type organic semiconductor materials described herein.
Figure 11:
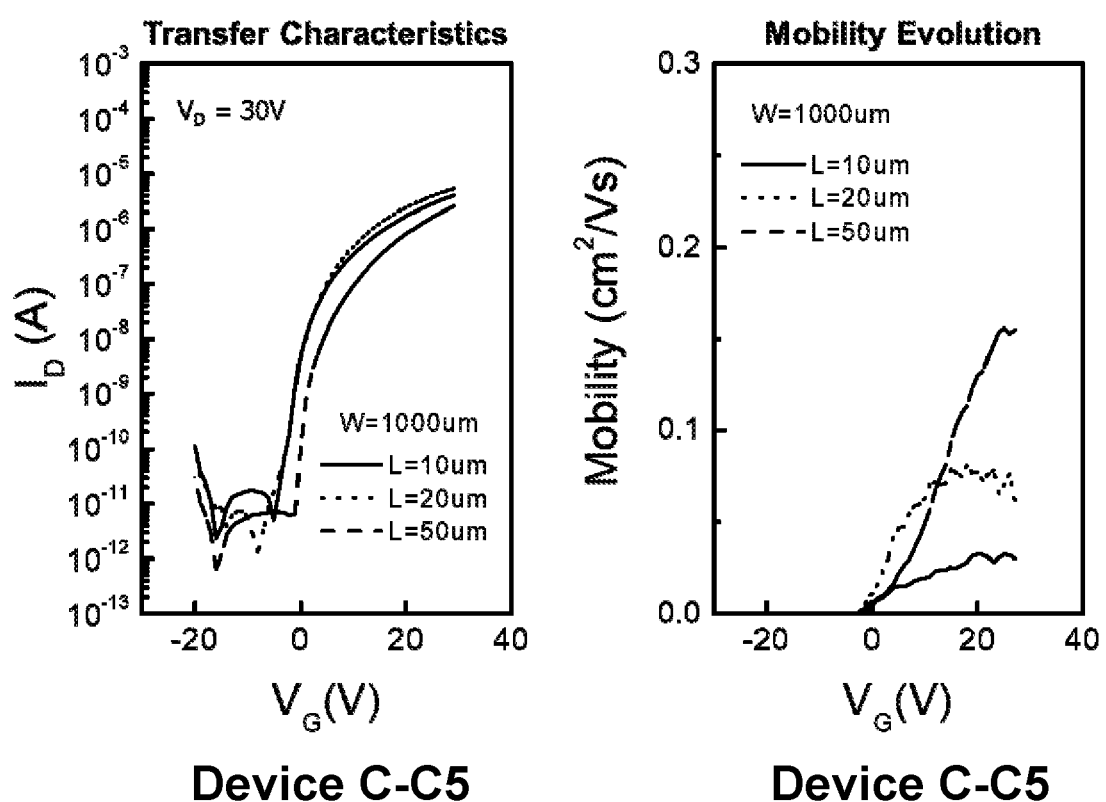
FIG. 11 is a set of graphs showing output characteristics for a thin-film transistor described herein.
Figure 12:
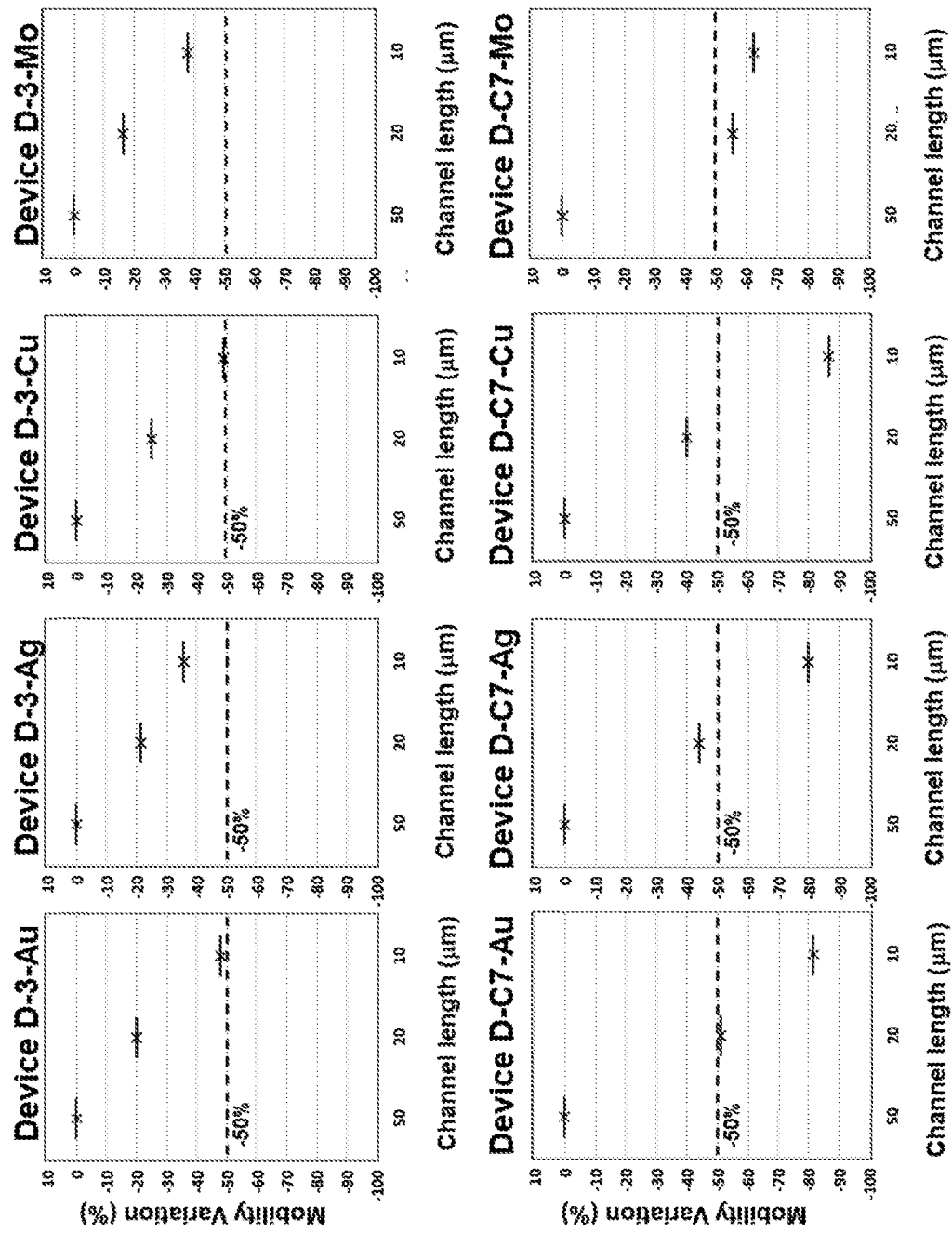
FIG. 12 is a set of graphs showing the carrier mobility variation between thin-film transistors having channel lengths of 50 μm and 20 μm or 10 μm comprising a variety of n-type organic semiconductor materials described herein.
Figure 13:
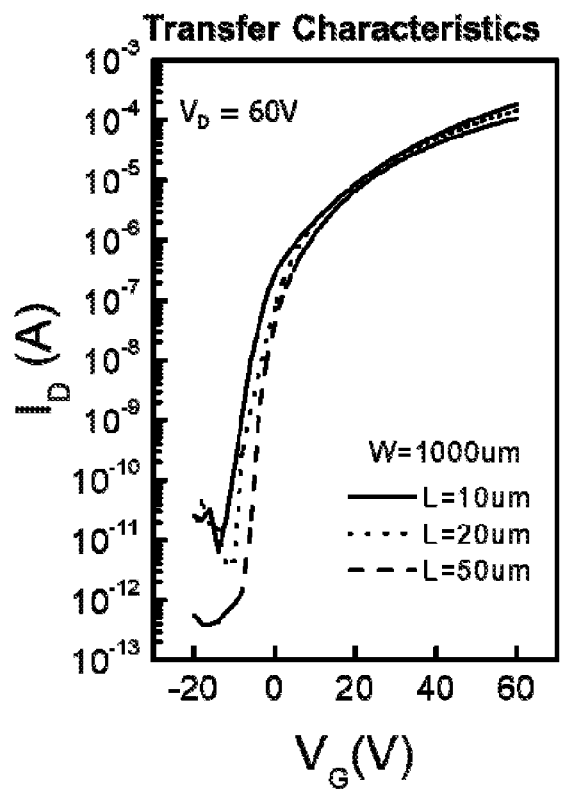
FIG. 13 is a set of graphs showing output characteristics for a thin-film transistor described herein.
Figure 13:
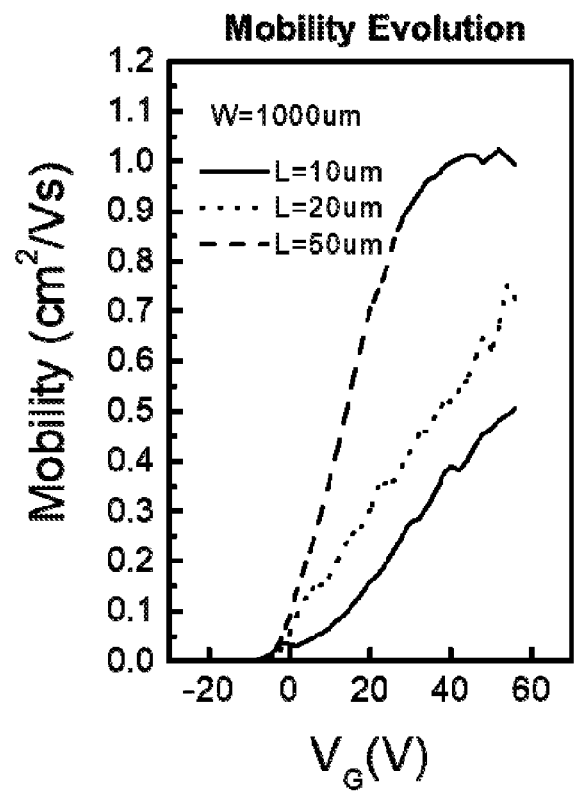
Figure 14:
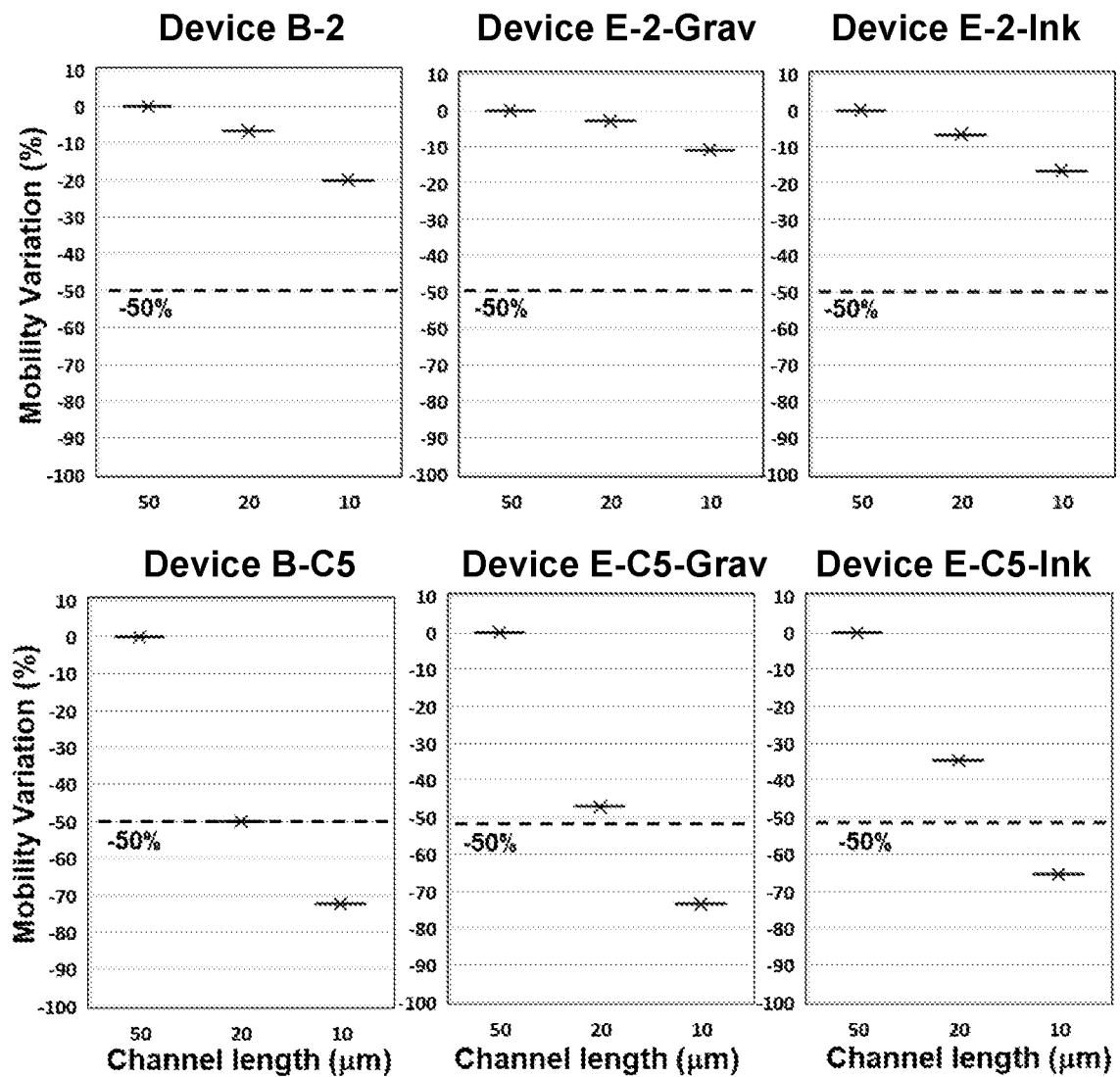
FIG. 14 is a set of graphs showing the carrier mobility variation between thin-film transistors having channel lengths of 50 μm and 20 μm or 10 μm comprising a variety of n-type organic semiconductor materials described herein.
Figure 15:
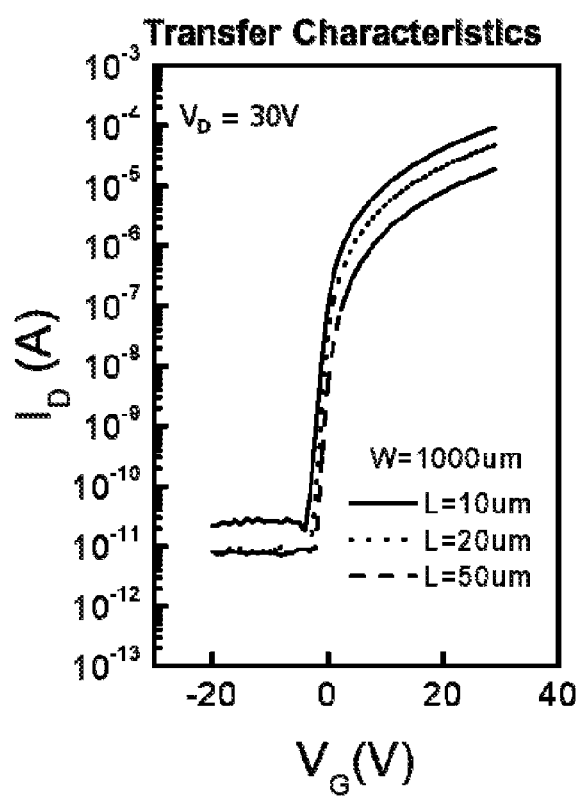
FIG. 15 is a set of graphs showing output characteristics for a thin-film transistor described herein.
Figure 15:
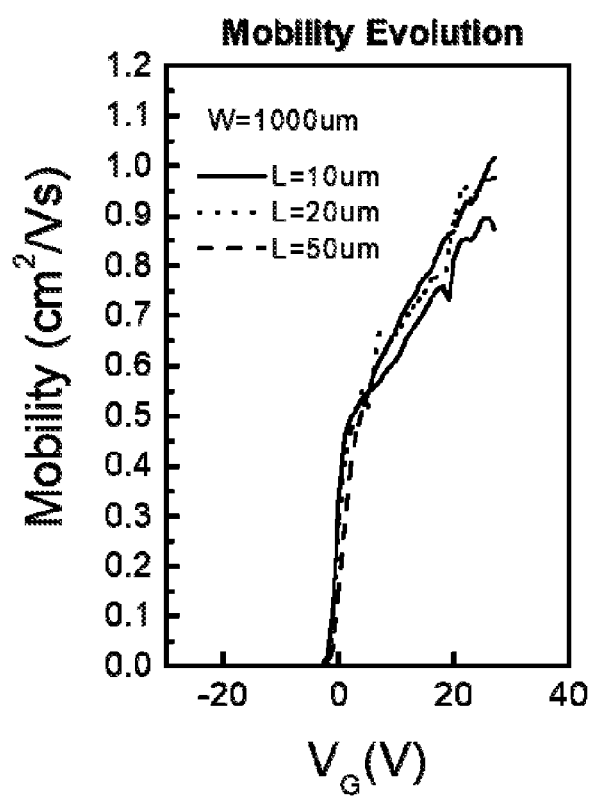
Figure 16:
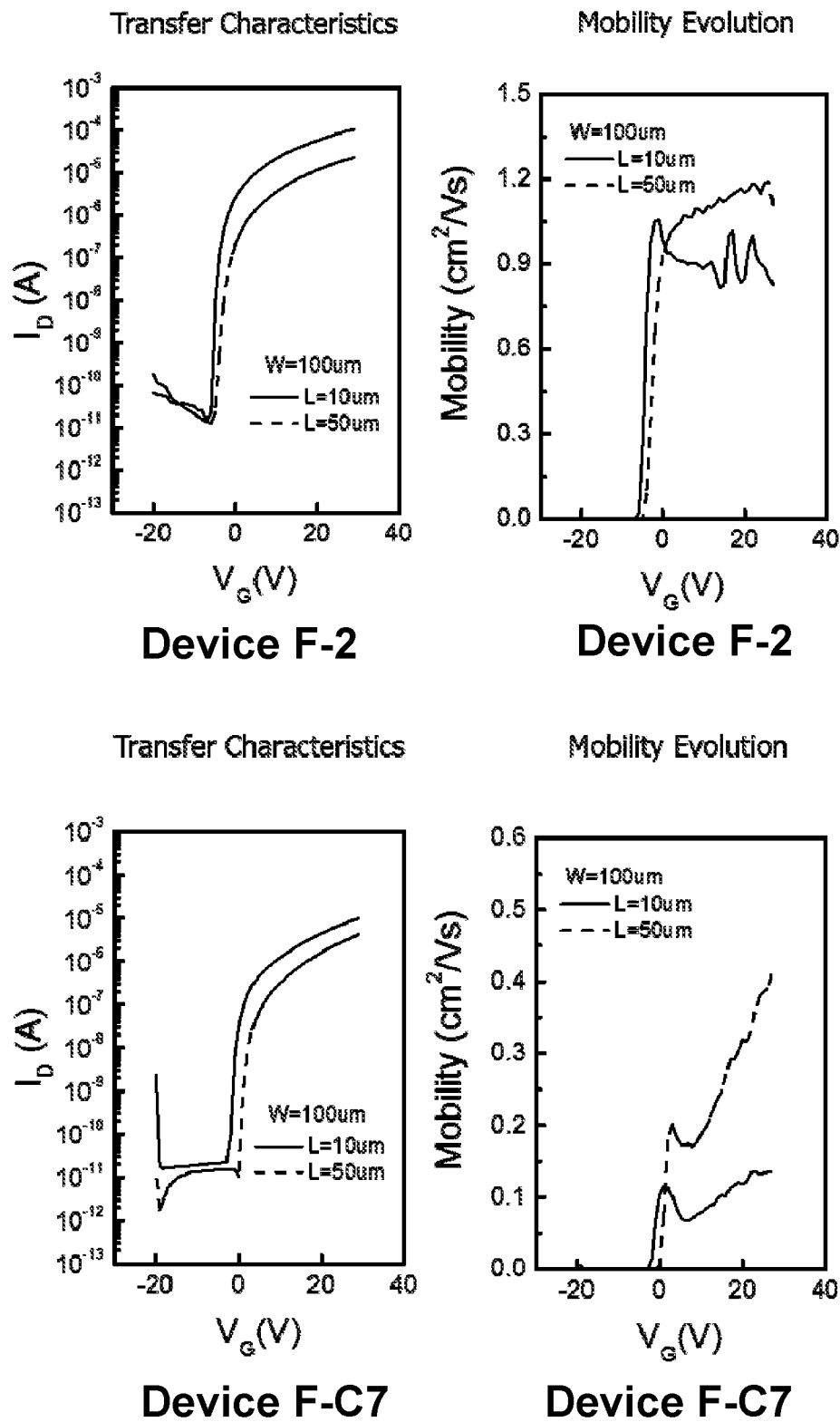
FIG. 16 is a set of graphs showing output characteristics for thin-film transistors described herein.

A partial schematic top view of a thin film transistor device according to one embodiment of the invention is provided as FIG. 5. This view shows only the overlap of the source and drain electrodes (52, 54) with the semiconductor component 56. Arrow 57 indicates the channel length. The channel width is indicated by arrow 58 and is measured as the distance over which the semiconductor component is disposed between the source and drain electrodes, in a direction perpendicular to the length.

The semiconductor component comprises one or more compounds selected from N,N'-bis[1-methylpropyl]-1,7-dicyanoperylene-3,4:9,10-bis(dicarboximide) (1A), N,N'-bis[1-methylpropyl]-1,6-dicyanoperylene-3,4:9,10-bis(dicarboximide) (1B), N,N'-bis[1-methylbutyl]-1,7-dicyanoperylene-3,4:9,10-bis(dicarboximide) (2A), N,N'-bis[1-methylbutyl]-1,6-dicyanoperylene-3,4:9,10-bis(dicarboximide) (2B), N,N'-bis[1-methylpentyl]-1,7-dicyanoperylene-3,4:9,10-bis(dicarboximide) (3A), and N,N'-bis[1-methylpentyl]-1,6-dicyanoperylene-3,4:9,10-bis(dicarboximide) (3B):

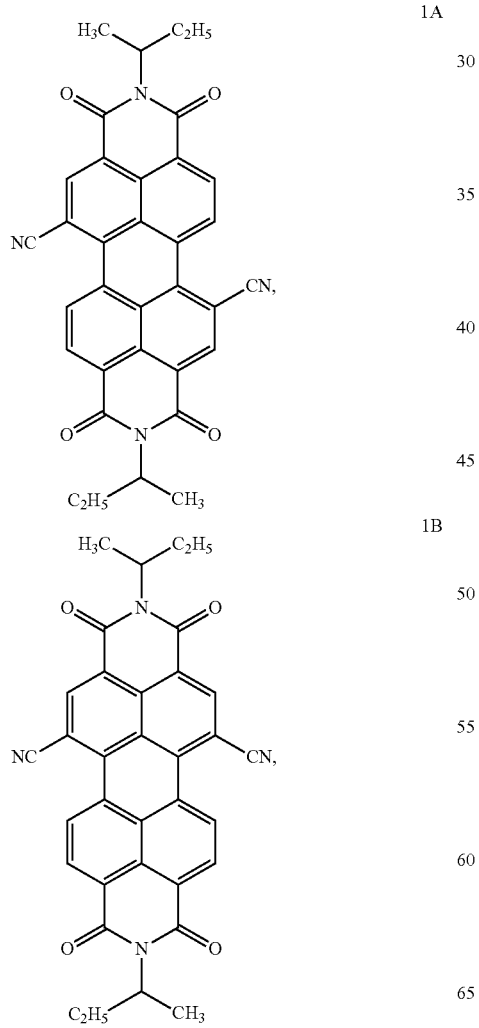

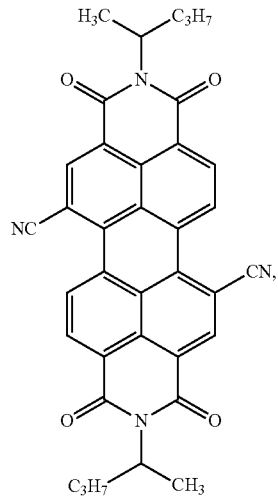

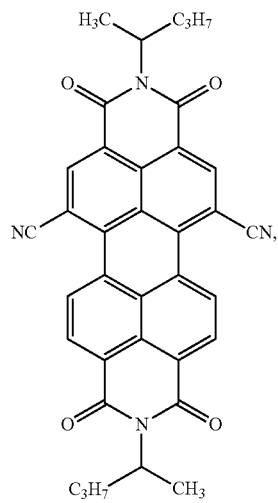

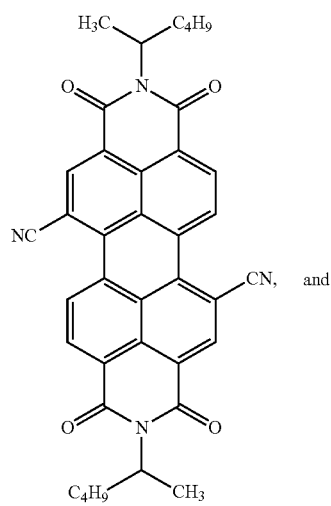

-continued

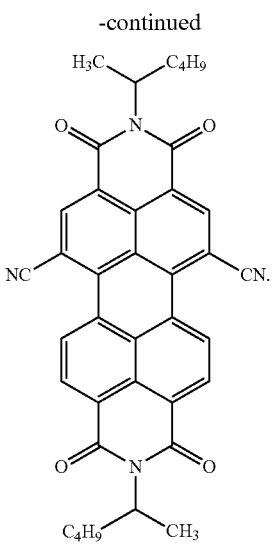

3B

Various synthetic methods for compounds of this type, and various details for their use, including solution processing to form thin film semiconductor devices, are described in U.S. Pat. Nos. 7,671,202, 7,902,363, 8,404,844 and 9,147,850, each of which is hereby incorporated herein by reference in its entirety.

In certain embodiments as otherwise described herein, the semiconductor component is formed from at least 75 wt. % of the one or more compounds. For example, in certain such embodiments, the semiconductor component is formed from at least 80 wt. %, or at least 85 wt. %, or at least 90 wt. %, or at least 92.5 wt. %, or at least 95 wt. %, or at least 97.5 wt. %, or at least 98 wt. %, or at least 98.5 wt. %, or at least 99 wt. %, or at least 99.5 wt. % of the one or more compounds. In certain embodiments as otherwise described herein, the semiconductor component consists essentially of the one or more compounds.

For example, in certain embodiments as otherwise described herein, the semiconductor component comprises compounds 1A and/or 1B, for example, a mixture of both regioisomeric compounds 1A and 1B. In certain such embodiments, the semiconductor component is formed from at least 75 wt. % (e.g., at least 90 wt. %, at least 95 wt. %, or at least 98 wt. %) of compounds 1A and/or 1B, e.g., a mixture of regioisomeric compounds 1A and 1B In certain such embodiments, the semiconductor component consists essentially of compounds 1A and/or 1B, e.g., a mixture of compounds 1A and 1B. In other embodiments, the semiconductor component is formed from at least 2 wt. % (e.g., at least 5 wt. %, at least 10 wt. %, or at least 25 wt. % or at least 40 wt %) of compounds 1A and/or 1B, for example, a mixture of both regioisomeric compounds 1A and 1B. In certain such embodiments, the semiconductor component can be provided in a matrix polymer, e.g., polystyrene, poly(alpha-methylstyrene), poly(alpha-vinylnaphthalene), poly(vinyltoluene), polyethylene, cis-polybutadiene, polypropylene, polyisoprene, poly(4-methyl-1-pentene), poly(4-methylstyrene), poly(chorotrifluoroethylene), poly(2-methyl-1,3-butadiene), poly(p-xylylene), poly(α-α-α'-α' tetrafluoro-p-xylylene), poly[1,1-(2-methyl propane)bis(4-phenyl)carbonate], poly(cyclohexyl methacrylate), poly (chlorostyrene), poly(2,6-dimethyl-1,4-phenylene ether), polyisobutylene, poly(vinyl cyclohexane), poly(vinylcinnamate), poly(4-vinylbiphenyl), polycarbonates, polyphenylene and cyclic olefin polymers such as those available under the tradename TOPAS. For example, the semiconductor component can be formed of at least 80 wt %, at least 90 wt % or even at least 95 wt % of compounds 1A and/or 1B and matrix polymer.

In certain embodiments as otherwise described herein, the molar ratio of compounds 1A and 1B (i.e., 1A:1B) is at least 2:1, for example, at least 3:1, at least 4:1, at at least 5:1 or at least 6:1. In certain such embodiments, the molar ratio 1A:1B is within the range 2:1 to 50:1, e.g., in the range of 3:1 to 50:1, or 3.5:1 to 50:1, or 4:1 to 50:1, or 5:1 to 50:1, or 6:1 to 50:1, or 5:1 to 25:1, or 6:1 to 10:1.

In another example, in certain embodiments as otherwise described herein, the semiconductor component comprises compounds 2A and/or 2B, for example, a mixture of both regioisomeric compounds 2A and 2B. In certain such embodiments, the semiconductor component is formed from at least 75 wt. % (e.g., at least 90 wt. %, at least 95 wt. %, or at least 98 wt. %) of compounds 2A and/or 2B, e.g., a mixture of regioisomeric compounds 1A and 2B. In certain such embodiments, the semiconductor component consists essentially of compounds 2A and/or 2B, e.g., a mixture of compounds 2A and 2B. In other embodiments, the semiconductor component is formed from at least 2 wt. % (e.g., at least 5 wt. %, at least 10 wt. %, or at least 25 wt. % or at least 40 wt %) of compounds 2A and/or 2B, for example, a mixture of both regioisomeric compounds 2A and 2B. In certain such embodiments, the semiconductor component can be provided in a matrix polymer, e.g., polystyrene, poly(alpha-methylstyrene), poly(alpha-vinylnaphthalene), poly(vinyltoluene), polyethylene, cis-polybutadiene, polypropylene, polyisoprene, poly(4-methyl-1-pentene), poly(4-methylstyrene), poly(chorotrifluoroethylene), poly(2-methyl-1,3-butadiene), poly(p-xylylene), poly(α-α-α'-α' tetrafluoro-p-xylylene), poly[1,1-(2-methyl propane)bis(4-phenyl)carbonate], poly(cyclohexyl methacrylate), poly (chlorostyrene), poly(2,6-dimethyl-1,4-phenylene ether), polyisobutylene, poly(vinyl cyclohexane), poly(vinylcinnamate), poly(4-vinylbiphenyl), polycarbonates, polyphenylene and cyclic olefin polymers such as those available under the tradename TOPAS. For example, the semiconductor component can be formed of at least 80 wt %, at least 90 wt % or even at least 95 wt % of compounds 1A and/or 1B and matrix polymer.

In certain embodiments as otherwise described herein, the molar ratio of compounds 2A and 2B (i.e., 2A:2B) is at least 2:1, for example, at least 3:1, at least 4:1, at at least 5:1 or at least 6:1. In certain such embodiments, the molar ratio 2A:2B is within the range of 2,5:1 to 50:1, e.g., in the range of 3:1 to 50:1, or 3.5:1 to 50:1, or 4:1 to 50:1, or 5:1 to 50:1, or 6:1 to 50:1, or 5:1 to 25:1, or 6:1 to 10:1.

In another example, in certain embodiments as otherwise described herein, the semiconductor component comprises compounds 3A and/or 3B, for example, a mixture of both regioisomeric compounds 3A and 3B. In certain such embodiments, the semiconductor component is formed from at least 75 wt. % (e.g., at least 90 wt. %, at least 95 wt. %, or at least 98 wt. %) of compounds 3A and/or 3B, for example, a mixture of both regioisomeric compounds 3A and 3B. In certain such embodiments, the semiconductor component consists essentially of compounds 3A and/or 3B, e.g., a mixture of compounds 3A and 3B. In other embodiments, the semiconductor component is formed from at least 2 wt. % (e.g., at least 5 wt. %, at least 10 wt. %, or at least 25 wt. % or at least 40 wt %) of compounds 3A and/or 3B, for example, a mixture of both regioisomeric compounds 3A and 3B. In certain such embodiments, the semiconductor component can be provided in a matrix polymer, e.g., polystyrene, poly(alpha-methylstyrene), poly(alpha-vinylnaphthalene), poly(vinyltoluene), polyethylene, cis-polybutadiene, polypropylene, polyisoprene, poly(4-methyl-1-pentene), poly(4-methylstyrene), poly(chorotrifluoroethylene), poly(2-methyl-1,3-butadiene), poly(p-xylylene), poly(α-α-α'-α' tetrafluoro-p-xylylene), poly[1,1-(2-methyl propane)bis(4-phenyl)carbonate], poly(cyclohexyl methacrylate), poly(chlorostyrene), poly(2,6-dimethyl-1,4-phenylene ether), polyisobutylene, poly(vinyl cyclohexane), poly(vinylcinnamate), poly(4-vinylbiphenyl), polycarbonates, polyphenylene and cyclic olefin polymers such as those available under the tradename TOPAS. For example, the semiconductor component can be formed of at least 80 wt %, at least 90 wt % or even at least 95 wt % of compounds 1A and/or 1B and matrix polymer.

In certain embodiments as otherwise described herein, the molar ratio of compounds 3A and/or 3B (i.e., 3A:3B) is at least 2:1, for example, at least 3:1, at least 4:1, at at least 5:1 or at least 6:1. In certain such embodiments, the molar ratio 3A:3B is within the range of 2.5:1 to 50:1, e.g., in the range of 3:1 to 50:1, or 3.5:1 to 50:1, or 4:1 to 50:1, or 5:1 to 50:1, or 6:1 to 50:1, or 5:1 to 25:1, or 6:1 to 10:1.

As noted above, the channel length of advantageous thin-film transistors as otherwise described herein is no more than 20 µm, e.g., in the range of 3-20 µm, or 5-20 µm, or 8-20 µm, or 10-20 µm. In certain embodiments as otherwise described herein, the channel length is no more than 18 µm, e.g., in the range of 3-18 µm, or 5-18 µm, or 8-18 µm, or 10-18 µm. In certain embodiments as otherwise described herein, the channel length is no more than 15 µm, e.g., in the range of 3-15 µm, or 5-15 µm, or 8-15 µm, or 10-15 µm. In certain embodiments as otherwise described herein, the channel length is no more than 14 µm, e.g., in the range of 3-14 µm, or 5-14 µm, or 8-14 µm, or 10-14 µm. In certain embodiments as otherwise described herein; the channel length is no more than 13 µm, e.g., in the range of 3-13 µm, or 5-13 µm, or 8-13 µm, or 10-13 µm. In certain embodiments as otherwise described herein; the channel length is no more than 12 µm, e.g., in the range of 3-12 µm, or 5-12 µm, or 8-12 µm, or 10-12 µm.

The person of ordinary skill in the art will select a thickness of the semiconductor component with reference to desired device properties, compound properties, device architecture and fabrication process. In certain embodiments as otherwise described herein, the semiconductor component has a thickness within the range of 10 nm to 100 nm. For example, in certain such embodiments, the semiconductor component thickness is within the range of 10 nm to 90 nm, or 10 nm to 80 nm, or 10 nm to 70 nm, or 10 nm to 60 nm, or 20 nm to 100 nm, or 30 nm to 100 nm, or 40 nm to 100 nm, or 20 nm to 90 nm, or 20 nm to 80 nm, or 20 nm to 70 nm, or 20 nm to 60 nm. In certain such embodiments, the channel length is no more than 18 µm (e.g., no more than 15 µm).

The thin-film transistor as otherwise described herein has a channel width perpendicular to the semiconductor component thickness and the channel length. In certain embodiments as otherwise described herein, the channel width is up to 4 mm, e.g., up to 3 mm, up to 2 mm, or up to 1 mm. In certain such embodiments, the channel width is within the range of 0.01 mm to 4 mm. For example, in certain embodiments, the channel width is within the range of 0.01 mm to 3 mm, or 0.01 mm to 2 mm, 010.01 mm to 1 mm, or 0.01 mm to 0.5 mm, or 0.01 mm to 0.3 mm, or 0.01 mm to 0.2 mm, or 0.01 mm to 0.15 mm, or 0.01 mm to 0.1 mm, or 0.015 mm to 4 mm, or 0.015 mm to 2 mm, or 0.015 mm to 1 mm, or 0.015 mm to 0.5 mm, or 0.015 mm to 0.2 mm, or 0.015 mm to 0.1 mm.

As noted above, the thin-film transistor as otherwise described herein includes a source electrode, a drain electrode, and a gate electrode. In certain embodiments as otherwise described herein, one or more of the source electrode, drain electrode, and gate electrode comprise a metal or metal alloy including copper, aluminum, gold, silver, platinum, palladium, molybdenum, nickel, or any mixture thereof, or an electrically conductive polymer such as polyethylenethioxythiophene (PEDOT). In certain embodiments as otherwise described herein, each of the source electrode, drain electrode, and gate electrode independently comprises a gold layer, a silver layer, a copper layer, or a molybdenum layer. In certain embodiments as otherwise described herein, one or more of the source electrode, drain electrode, and gate electrode independently comprises a silver layer. In certain such embodiments, each of the source electrode, drain electrode, and gate electrode comprises a silver layer. In certain such embodiments, one or more of (e.g., each of) the source electrode and drain electrode further comprise a contact-modification layer (e.g., disposed adjacent the semiconductor component, to facilitate charge injection), such as a self-assembled monolayer. In certain such embodiments, the gate electrode further comprises a contact-modification layer (e.g., disposed adjacent the dielectric layer).

Each of the source electrode, drain electrode, and gate electrode of the thin-film transistor as otherwise described herein independently has a thickness in the direction of the semiconductor component thickness. In certain embodiments as otherwise described herein, each of the source electrode, drain electrode, and gate electrode independently has a thickness within the range of 30 nm to 500 nm.

As noted above, the thin-film transistor as otherwise described herein comprises a dielectric layer. In certain embodiments, the dielectric layer has a dielectric constant that is at least 2.5, or even at least 4. In certain embodiments as otherwise described herein, the dielectric layer has a dielectric constant in the range of 2.5-25, for example, in the range of 2.5-15, 2.5-10, or 2.5-7, or 4-25, or 4-15, or 4-10, or 4-7. In certain embodiments as otherwise described herein, the sheet capacitance of the dielectric layer is within the range of 3 nF/cm$^2$ to 30 nF/cm$^2$. For example, in certain such embodiments, the sheet capacitance of the dielectric layer is within the range of 3 nF/cm$^2$ to 22.5 nF/cm$^2$, or 3 nF/cm$^2$ to 20 nF/cm$^2$, or 3 nF/cm$^2$ to 17.5 nF/cm$^2$, or 3 nF/cm$^2$ to 15 nF/cm$^2$, or 3 nF/cm$^2$ to 12.5 nF/cm$^2$, or 3 nF/cm$^2$ to 10 nF/cm$^2$, or 5 nF/cm$^2$ to 30 nF/cm$^2$, or 7.5 nF/cm$^2$ to 30 nF/cm$^2$, or 10 nF/cm$^2$ to 30 nF/cm$^2$, or 12.5 nF/cm$^2$ to 30 nF/cm$^2$, or 15 nF/cm$^2$ to 30 nF/cm$^2$, or 17.5 nF/cm$^2$ to 30 nF/cm$^2$, or 20 nF/cm$^2$ to 30 nF/cm$^2$, or 5 nF/cm$^2$ to 25 nF/cm$^2$, or 7.5 nF/cm$^2$ to 20 nF/cm$^2$, or 10 nF/cm$^2$ to 15 nF/cm$^2$, In certain embodiments as otherwise described herein, the dielectric layer comprises one or more dielectric materials (e.g., as a mixture, or as two or more sublayers) selected from dielectric polymers and inorganic (e.g., metal oxide) dielectric materials. As used herein, the term "dielectric material" refers to materials having a conductivity on the order of $10^{-5}$ S·cm$^{-1}$ or less. In certain such embodiments, a dielectric layer including a dielectric polymer layer and an inorganic dielectric material layer further includes an interlayer (i.e., to improve layer compatibility). In certain embodiments as otherwise described herein, the dielectric layer includes one or more dielectric polymers selected from fluorinated para-xylene, fluoropolyarylether, fluorinated polyimide, polystyrene, poly(α-methyl styrene), poly(α-vinylnaphthalene), poly(vinyltoluene), polyethylene, cis-polybutadiene, polypropylene, polyisoprene, poly (4-methyl-1-pentene), poly(tetrafluorethylene), poly(chlorotrifluoroethylene), poly(2-methyl-1,3-butadiene), poly(p-xylylene), poly(α-α-α'-α'-tetrafluoro-p-xylylene), poly[1,1-(2-methyl propane) bis (4-phenyl) carbonate], poly(cyclohexyl methacrylate), poly(4-chlorostyrene), poly(2,6-dichlorostyrene), poly(4-bromostyrene), poly(2,6-dimethyl-1,4-phenylene ether), polyisobutylene, poly(vinyl cyclohexane), poly(arylene ether), polyphenylene, poly(ethylene/tetrafluoroethyelene), poly(ethylene/chlorotrifluoroethylene), fluorinated ethylene/propylene copolymer, polystyrene-co-α-methyl styrene, ethylene/ethyl acetate copolymer, poly(styrene/butadiene), poly(styrene/2,4-dimethylstyrene), polypropylene-co-1-butene, poly(methyl methacrylate), poly(ethyl methacrylate), poly(2-hydroxyethyl methacrylate), poly(butyl methacrylate), poly(hexyl methacrylate), poly(benzyl methacrylate), poly(vinyl phenol), poly(vinyl alcohol), poly(vinyl alcohol-co-ethylene), poly(isobutylene/methyl methacrylate), poly(vinyl phenol/methyl methacrylate), poly(vinyl chloride), polysaccharides such as 2-hydroxyethyl cellulose, cellulose actate, cellullose acetate butyrate, ethyl cellulose; cyanated (ethoxylated) polysaccharides such as cyanopullulan (e.g., CYMM®), benzocyclobutene-based polymers, poly(2-vinylpyridine), poly(4-vinylpyridine), poly(4-vinylpyridine-co-butyl methacrylate), poly(4-vinylpyridine-co-styrene), poly(l-vinylpyrrolidone-co-styrene), poly(l-vinylpyrrolidone-co-vinyl acetate), poly(vinylidine fluoride), polyacrylonitrile, poly(acrylonitrile-co-butadiene-co-styrene), poly(acrylonitrile-co-methyl acrylate), polyacrylamide, poly(N-isopropylacrylamide), poly(2-ethyl-2-oxazoline), polyvinylpyrrolidone, poly(pentafluorostyrene), poly(dimethylsiloxane), poly(tetrahydrofuran), poly(methyl vinyl ether), poly(methyl vinyl ether-alt-maleic anhydride), poly(ethyl vinyl ether), poly(ethylene-alt-maleic anhydride), poly(allylamine), poly(ethyleneimine), poly(vinyl acetate), poly(vinyl cinnamate), poly(vinyl stearate), poly(vinyl propionate), poly(vinyl formate), poly(ethylene glycol), poly(propylene glycol), poly(styrene-co-acrylonitrile), poly(maleic anhydride-alt-1-octadecane), poly(tetrahydrofuryl methacrylate), poly(Bisphenol A carbonate), poly(propylene carbonate), poly(1,4-butylene terephthalate), poly(diallyl isophthalate), poly(hexafluoropropylene oxide), poly(fluoropropylene oxide-co-perfluoroformaldehyde), and perfluoro(1-butenyl vinyl ether) homocyclopolymers (e.g., CYTOP®).

In certain embodiments as otherwise described herein, the thin-film transistor further comprises a substrate supporting the various device components described above. The person of ordinary skill in the art will appreciate that a variety of materials can be used as substrates. In certain embodiments as otherwise described herein, the thin-film transistor includes a substrate comprising a plastic layer, a semiconductor layer (e.g. a silicon layer) and/or a glass layer. For example, in certain such embodiments, the substrate comprises a plastic layer comprising one or more of a polyester (such as polyethylene terephthalate, polyethylene naphthalate, and polycarbonate), polyolefin (such as polypropylene, polyvinyl chloride, and polystyrene), polyphenylene sulfide (such as polyphenylene sulfide), polyamide, aromatic polyamide, polyether ether ketone, polyimide, acrylic resin, and polymethylmethacrylate. In another example, in certain embodiments the substrate comprises a glass layer such as, for example, soda lime glass, quartz, and VYCOR®. Semiconductor substrates such as silicon can also be used. In certain embodiments as otherwise described herein, the substrate further comprises a buffer layer or planarization layer (e.g., disposed adjacent the stack of device layers, to improve layer compatibility).

Advantageously, the present inventors have determined the use of the n-type organic semiconductor materials described herein can exhibit relatively high carrier mobility in a short-channel thin-film transistor (e.g., having a channel length of at most 20 µm, or at most 15 µm, or at most 10 µm). For example, in certain embodiments, a thin-film transistor as otherwise described herein (i.e., having a channel length no more than 20 µm) has a carrier mobility that is at least 50% of a carrier mobility of an otherwise identical transistor having a channel length of 50 µm. In certain such embodiments, a thin-film transistor as otherwise described herein has a carrier mobility that is at least 55%, or at least 60%, or at least 65%, or at least 70%, or at least 75%, or at least 80% of a carrier mobility of an otherwise identical transistor having a channel length of 50 µm.

The thin-film transistors described herein can be fabricated by one or more of various deposition processes known to those skilled in the art. For example, the semiconductor component, source electrode, and drain electrode of a thin-film transistor as otherwise described herein can be formed by processes such as, for example, sputtering, ion-assisted deposition (IAD), physical vapor deposition, printing (e.g., flexo printing, litho printing, gravure printing, ink-jetting, pad printing, etc.), drop casting, dip coating, doctor blading, roll coating, and spin-coating. For example, a coating formulation comprising an organic n-type semiconductor material as described herein can be deposited onto a substrate between a source electrode and a drain electrode via solution-phase to form the semiconductor component of a top-gate thin-film transistor. In various aspects and embodiments, electrical contacts (e.g., the source, drain, and/or gate electrodes) can be formed by processes such as, for example, thermal evaporation, radiofrequency or e-beam sputtering, flexo printing, litho printing, gravure printing, ink-jetting, pad printing, screen printing, drop casting, dip coating, doctor blading, roll coating, and spin-coating. The person of ordinary skill in the art will select the processes and parameters that provide the desired structure (e.g., configuration, semiconductor component thickness, channel length, etc.).

EXAMPLES

The Examples that follow are illustrative of specific embodiments of the invention, and various uses thereof. They are set forth for explanatory purposes only, and are not to be taken as limiting the invention.

Device Fabrication n-Type organic semiconductor materials 1-3 and comparative materials C4-C8 (see Table 1, below) were prepared according to known methods. Materials were evaluated in a top-gate bottom-contact transistor configuration. The substrate materials were glass (PGO glass), PEN (e.g., provided by DuPont), or PI substrates, Commercially available dielectric materials (e.g., CYTOP®, poly(methyl methacrylate) (PMMA), etc.) were used. Electrical contacts were Au, Ag, Cu, or Mo. All device fabrication processes other than metal evaporation and sputtering, were performed under ambient conditions.

TABLE 1 n-type Semiconductor Materials

| Material | Components |
|---|---|
| 1 | 1A - N,N'-bis[1-methylpropyl]-1,7-dicyanoperylene-3,4:9,10-bis(dicarboximide) (85-95 mol. %)<br>1B - N,N'-bis[1-methylpropyl]-1,6-dicyanoperylene-3,4:9,10-bis(dicarboximide) (5-15 mol. %) |
| 2 | 2A - N,N'-bis[1-methylbutyl]-1,7-dicyanoperylene-3,4:9,10-bis(dicarboximide) (85-95 mol. %)<br>2B - N,N'-bis[1-methylbutyl]-1,6-dicyanoperylene-3,4:9,10-bis(dicarboximide) (5-15 mol. %) |
| 3 | 3A - N,N'-bis[1-methylpentyl]-1,7-dicyanoperylene-3,4:9,10-bis(dicarboximide) (85-95 mol. %)<br>3B - N,N'-bis[1-methylpentyl]-1,6-dicyanoperylene-3,4:9,10-bis(dicarboximide) (5-15 mol. %) |
| C4 | N,N'-bis[1-methylhexyl]-1,7-dicyanoperylene-3,4:9,10-bis(dicarboximide) (85-95 mol. %)<br>N,N'-bis[1-methylhexyl]-1,6-dicyanoperylene-3,4:9,10-bis(dicarboximide) (5-15 mol. %) |
| C5 | N,N'-bis[2-ethylhexyl]-1,7-dicyanoperylene-3,4:9,10-bis(dicarboximide) (85-95 mol. %)<br>N,N'-bis[2-ethylhexyl]-1,6-dicyanoperylene-3,4:9,10-bis(dicarboximide) (5-15 mol. %) |
| C6 | N,N'-bis[2-propylhexyl]-1,7-dicyanoperylene-3,4:9,10-bis(dicarboximide) (85-95 mol. %)<br>N,N'-bis[2-propylhexyl]-1,6-dicyanoperylene-3,4:9,10-bis(dicarboximide) (5-15 mol. %) |
| C7 | N,N'-bis[1-ethylpropyl]-1,7-dicyanoperylene-3,4:9,10-bis(dicarboximide) (85-95 mol. %)<br>N,N'-bis[1-ethylpropyl]-1,6-dicyanoperylene-3,4:9,10-bis(dicarboximide) (5-15 mol. %) |
| C8 | N,N'-bis[n-octyl]-1,7-dicyanoperylene-3,4:9,10-bis(dicarboximide) (85-95 mol. %)<br>N,N'-bis[n-octyl]-1,6-dicyanoperylene-3,4:9,10-bis(dicarboximide) (5-15 mol. %) |

Example 1. Thin-Film Transistor A

Otherwise identical top-gate bottom-contact thin-film transistors having varied channel lengths comprising one of semiconductor materials 1-3 and comparative materials C4-C8 were fabricated on polyethylene naphthalate (PEN) substrates. The substrates were coated with a planarization film. A dioxane solution of planarization material was spin-coated (80-110 mg/mL; 1500-2000 rpm) onto the substrates to afford a ~300-500 nm-thick layer. This film was cross-linked with UV light ($\lambda$=300 nm) and dried on a hotplate (110° C., 10 minutes) to afford a robust, completely insoluble planarization layer. Sputtered Ag source-drain contacts (30-500 nm thick) were patterned by photolithography. Channel lengths and widths were 10-50 µm and 1 mm, respectively. A contact modification layer was applied (~1-5 wt. % in ether solvent, puddling 5 min., spin dry) on contacts to improve semiconductor/contact interface. These substrates were coated with the semiconductor material, deposited by spin-coating (concentration ~1-10 mg/mL in a hydrocarbon mixture, 700-2000 rpm, film dried on a hotplate at ~110° C. for 5 minutes). Typical semiconductor film thicknesses were 20-60 nm. Next, the dielectric layer was spin-coated (~20-200 mg/mL, 700-2000 rpm). The film dielectric constant ($\varepsilon$) was ~3.0-3.2, and the sheet capacitance of the film was ~4 nF/cm$^2$. Devices A-1, A-2, A-3, A-C3, A-C4, A-C5, A-C6, A-C7, and A-C8 were completed by photolithography patterning of a sputtered Ag layer (30-150 nm thick) to form gate contacts (see Table 2, below).

Example 2. Thin-Film Transistor B

Otherwise identical top-gate bottom-contact thin-film transistors having varied channel lengths comprising one of semiconductor materials 1-2 and of comparative materials C5-C6 were fabricated on polyethylene naphthalate (PEN) substrates. The substrates were coated with a planarization film. A dioxane solution of planarization material was spin-coated (80-110 mg/mL; 1500-2000 rpm) onto the substrates to afford a ~300-500 nm-thick layer. This film was cross-linked with UV light ($\lambda$=300 nm) and dried on a hotplate (110° C., 10 minutes) to afford a robust, completely insoluble planarization layer. Sputtered Ag source-drain contacts (30-500 nm thick) were patterned by photolithography. Channel lengths and widths were 5-50 µm and 1 mm, respectively. A contact modification layer was applied (~1-5 wt. % in ether solvent, puddling 5 min., spin dry) on contacts to improve semiconductor/contact interface. These substrates were coated with the semiconductor material, deposited by spin-coating (concentration ~1-10 mg/mL in a hydrocarbon mixture, 700-2000 rpm, film dried on a hotplate at ~110° C. for 5 minutes). Typical semiconductor film thicknesses were 20-60 nm. Next, a CYTOP® dielectric layer was spin-coated (AGC CTL-809M, 1500-3000 rpm). The film dielectric constant ($\varepsilon$) was ~2.4 and the sheet capacitance of the film was ~3 nF/cm$^2$. Devices B-1, B-2, B-C5, and B-C6 were completed by vapor deposition of patterned Au gate contacts (~100 nm thick) through a shadow mask (see Table 3, below).

Example 3. Thin-Film Transistor C

Otherwise identical top-gate bottom-contact thin-film transistors having varied channel lengths comprising one of semiconductor materials 2-3, of comparative material C5, and of comparative material C7 were fabricated on polyethylene naphthalate (PEN) substrates. The substrates were coated with a planarization film. A dioxane solution of planarization material was spin-coated (80-110 mg/mL; 1500-2000 rpm) onto the substrates to afford a ~300-500 nm-thick layer. This film was crosslinked with UV light (λ=300 nm) and dried on a hotplate (110° C., 10 minutes) to afford a robust, completely insoluble planarization layer. Thermally-evaporated Au metal source-drain contacts (30-500 nm-thick) were patterned by photolithography. Channel lengths and widths were 10-50 μm and 1 mm, respectively. A contact modification layer was applied (~1-5 wt. % in ether solvent, puddling 5 min., spin dry) on contacts to improve semiconductor,/contact interface. These substrates were coated with the semiconductor material, deposited by spin-coating (concentration ~1-10 mg/mL in a hydrocarbon mixture, 700-2000 rpm, film dried on a hotplate at ~110° C. for 5 minutes). Typical semiconductor film thicknesses were 20-60 nm. Next, a PMMA dielectric layer was spin coated (30~100 mg/ml in acetate mixture, 1500-3000 rpm). The film dielectric constant (E) was ~3.3 and the sheet capacitance of the film was ~4 nF/cm². Devices C-2, C-3, C-C5, and C-C7 were completed by vapor deposition of patterned Au gate contacts (~100 nm thick) through a shadow mask (see Table 4, below).

Example 4. Thin-Film Transistor D

Otherwise identical top-gate bottom-contact thin-film transistors having varied channel lengths comprising one of semiconductor materials 3 and of comparative material C7 were fabricated with gold, silver, copper, and molybdenum electrodes on polyethylene naphthalate (PEN) substrates. The substrates were coated with a planarization film. A dioxane solution of planarization material was spin-coated (80-110 mg/mL; 1500-2000 rpm) onto the substrates to afford a ~300-500 nm-thick layer. This film was crosslinked with UV light (λ=300 nm) and dried on a hotplate (110° C., 10 minutes) to afford a robust, completely insoluble planarization layer. Thermally-evaporated or sputtered (Au, Ag, Cu, or Mo) metal source-drain contacts (30-500 nm-thick) were patterned by photolithography. Channel lengths and widths were 10-50 μm and 1 mm, respectively. Various contact modification layers were applied on different contacts, respectively to improve semiconductor/contact interface. These substrates were coated with the semiconductor material, deposited by spin-coating (concentration ~1-10 mg/mL in a hydrocarbon mixture, 700-2000 rpm, film dried on a hotplate at ~110° C. for 5 minutes). Typical semiconductor film thicknesses were 20-60 nm. Next, a PMMA dielectric layer was spin coated (30~100 mg/ml in acetate mixture, 1500-3000 rpm). The film dielectric constant (E) was ~3.3 and the sheet capacitance of the film was ~4 nF/cm². Devices D-3-Au, D-3-Ag, D-3-Cu, D-3-Mo, D-C7-Au, D-C7-Ag, D-C7-Cu, and D-C7-Mo were completed by vapor deposition of patterned gate contacts (Au, Ag, Cu, or Mo; ~100 nm thick) through a shadow mask (see Table 5, below).

Example 5. Thin-Film Transistor E

Otherwise identical top-gate bottom-contact thin-film transistors having varied channel lengths comprising one of semiconductor materials 2 and of comparative material C5 were fabricated via gravure printing and inkjet printing on PEN substrates. The substrates were coated with a planarization film. A dioxane solution of planarization material was spin-coated (80-110 mg/mL; 1500-2000 rpm) onto the substrates to afford a ~300-500 nm-thick layer. This film was crosslinked with UV light (λ=300 nm) and dried on a hotplate (110° C., 10 minutes) to afford a robust, completely insoluble planarization layer. Sputtered Ag source-drain contacts (30-500 nm-thick) were patterned by photolithography. Channel lengths and widths were 10-50 μm and 1 mm, respectively. A contact modification layer was applied (~1-5 wt. % in ether solvent, puddling 5 min., spin dry) on contacts to improve semiconductor/contact interface. These substrates were coated with the semiconductor material, deposited by gravure printing (concentration ~0.2-2% w/w in hydrocarbon mixture, Norbert Schlafli Labratester printer, pitch size 71 um, mesh size 140 lines/cm, cell volume 7.2 ml/m², printing speed 0.1 m/s,) or inkjet printing (concentration ~0.2-2% w/w in hydrocarbon solvent, Fujifilm Dimatix DMP-2850 printer, droplet size=10 pL). Semiconductor films were then dried on a hotplate at ~110° C. for 5 minutes. Typical semiconductor film thicknesses were 20-100 nm. Next, a CYTOP® dielectric layer was spin-coated (AGC CTL-809M, 1500-3000 rpm). The film dielectric constant (ε) was ~2.4 and the sheet capacitance of the film was ~3 nF/cm². Devices E-2-Gray, E-2-Ink, E-C5-Grav, and E-C5-Ink were completed by vapor deposition of patterned Au gate contacts (~100 nm thick) through a shadow mask (see Table 6, below).

Example 6. Thin-Film Transistor F

Otherwise identical top-gate bottom-contact thin-film transistors having varied channel lengths comprising one of semiconductor materials 2 and of comparative material C7 were fabricated on glass substrates. The substrates were coated with a planarization film. A dioxane solution of planarization material was spin-coated (80-110 mg/mL; 1500-2000 rpm) onto the substrates to afford a ~300-500 nm-thick layer. This film was crosslinked with UV light (λ=300 nm) and dried on a hotplate (110° C., 10 minutes) to afford a robust, completely insoluble planarization layer. Sputtered Ag source-drain contacts (30-500 nm-thick) were patterned by photolithography. Channel lengths and widths were 10-50 μm and 0.1 mm, respectively. These substrates were coated with the semiconductor material, deposited by spin-coating (concentration ~1-10 mg/mL in a hydrocarbon mixture, 700-2000 rpm, film dried on a hotplate at ~110° C. for 5 minutes). Typical semiconductor film thicknesses were 20-60 nm. Next, a dielectric layer was spin coated (20~200 mg/mL, 700-2000 rpm) and exposed to UV light. The dielectric constant of the film was ~12 and the sheet capacitance of the film was ~20 nF/cm², ~5-7 times higher than that of the dielectric layers of Examples 2-5. Devices F-2 and F-C7 were completed by vapor deposition of patterned Ag gate contacts (~100 nm thick) through a shadow mask (see Table 7, below).

Example 7. Thin-Film Transistor G

Otherwise identical top-gate bottom-contact thin-film transistors comprising a mixture of ~63-93 mol. % N,N'-bis[1-methylbutyl]-1,7-dicyanoperylene-3,4:9,10-bis(dicarboximide) (Compound 2A) and balance N,N'-bis[1-methylbutyl]-1,6-dicyanoperylene-3,4:9,10-bis(dicarboximide) (Compound 2B), or a comparative mixture of ~72-94 mol. % N,N'-bis[2-ethylhexyl]-1,7-dicyanoperylene-3,4:9,10-bis(dicarboximide) (Compound C5A) and balance N,N'-bis[2-ethylhexyl]-1,6-dicyanoperylene-3,4:9,10-bis(dicarboximide) (Compound C5B) were fabricated on glass substrates. The substrates were coated with a planarization film. A dioxane solution of planarization material was spin-coated (80-110 mg/mL; 1500-2000 rpm) onto the substrates to afford a ~300-500 nm-thick layer. This film was crosslinked with UV light (λ=300 nm) and dried on a hotplate (110° C., 10 minutes) to afford a robust, completely insoluble planarization layer. Thermally evaporated Au source-drain contacts (50 nm thick) were patterned through a shadow mask. Channel length and width were 50 μm and 0.1 mm, respectively. A contact modification layer was applied (~1-5 wt. % in ether solvent, puddling 5 min., spin dry) on contacts to improve semiconductor/contact interface. These substrates were coated with the semiconductor material, deposited by spin-coating (concentration ~1-10 mg/mL in a hydrocarbon mixture, 700-2000 rpm, film dried on a hotplate at ~110° C. for 5 minutes). Typical semiconductor film thicknesses were 20-60 nm. Next, the dielectric layer was spin-coated (~20-200 mg/mL, 700-2000 rpm). The film dielectric constant (ε) was ~3.0-3.2 and the sheet capacitance of the film was ~4 nF/cm². Devices were completed by a thermally evaporated Au layer (50 nm thick) to form the gate contact.

Example 8. Thin-Film Transistor H

Otherwise identical top-gate bottom-contact thin-film transistors having varied channel lengths comprising semiconductor material 2 were fabricated via gravure printing on PEN substrates. The substrates were coated with a planarization layer. A dioxane solution of planarization material was spin-coated (80-110 mg/mL; 1500-2000 rpm) onto the substrates to afford a ~300-500 nm-thick layer. This film was crosslinked with UV light (λ=300 nm) and dried on a hotplate (110° C., 10 minutes) to afford a robust, completely insoluble planarization layer. Ag source-drain contacts (30-500 nm-thick) were gravure printed (Inktek Ag colloid ink, Norbert Schlafli Labratester printer, pitch size 71 UM, mesh size 140 lines/cm, cell volume 7.2 ml/m², printing speed 0.1 m/s) followed by a 120° C./10 min thermal annealing in a nitrogen oven. Channel lengths and widths were 20-50 μm and 1 mm, respectively. A contact modification layer was applied (~1-5 wt. % in ether solvent, puddling 5 min, spin dry) on contacts to improve semiconductor/contact interface. These substrates were coated with the semiconductor material, deposited by gravure printing (concentration ~0.2-2% w/w in an hydrocarbon mixture, Norbert Schlafli Labratester printer, pitch size 71 um, mesh size 140 lines/cm, cell volume 7.2 ml/m², printing speed 0.1 m/s). The semiconductor films were then dried on a hotplate at ~110° C. for 5 minutes. Typical semiconductor film thicknesses were 20-100 nm. Next, a dielectric layer was gravure printed (concentration ~0.5-5% w/w in ether solvent, Norbert Schlafli Labratester printer, pitch size 71 μm, mesh size 140 lines/cm, cell volume 7.2 ml/m², printing speed 0.1 m/s). The film dielectric constant (ε) was 3.0~3.2 and the sheet capacitance of the film was ~3.2 nF/cm². Device H-2 was completed by gravure printing of patterned Ag gate contacts (Inktek Ag colloid ink, Norbert Schlafli Labratester printer, ~100 nm thick).

Example 9. Device Characterization

A Keithley 4200 semiconductor characterization system was used to perform all electrical/TFT characterizations concerning the bottom gate devices. The 4200 SCS system consists of three source measurement units (SMU), all of which were supplied with remote pre-amplifiers. The other major component of the test system was a Signatone probe station. Triax cable and probes were used for all electrodes to provide the first level of shielding. A dark/metal box enclosure was used to avoid light exposure and to further reduce environmental noise.

Transistor carrier mobilities (μ) were calculated by standard field effect transistor equations. In traditional metal-insulator-semiconductor FETs (MISFETs), there is typically a linear and saturated regime in the $I_{DS}$ vs $V_{DS}$ curves at different $V_G$ (where $I_{DS}$ is the source-drain saturation current, $V_{DS}$ is the potential between the source and drain, and $V_G$ is the gate voltage). At large $V_{DS}$, the current saturates and is given by:

$$(I_{DS})^{sat} = (WC_i/2L)\mu(V_G - V_t)^2 \qquad (1)$$

where L and W are the device channel length and width, respectively, $C_i$ is the capacitance of the gate insulator, and $V_t$ is the threshold voltage. Mobilities (μ) were calculated in the saturation regime by rearranging equation (1):

$$\mu_{sat} = (2I_{DS}L)/[WC_i(V_G - V_t)^2] \qquad (2)$$

The threshold voltage ($V_t$) can be estimated as the x intercept of the linear section of the plot of $V_G$ versus $(I_{DS})^{1/2}$.

Tables 2-9 summarize the performance parameters of devices A-F and H measured under ambient conditions including the field-effect electron mobility ($\mu_e$, in saturation), current on-to-off ratio ($I_{on}:I_{off}$). Various performance measurements are shown in FIGS. 6-16 and 18-19.

TABLE 2

Device A Performance (Example 1)

| | 50 μm | | 10 μm | | Mobility |
|---|---|---|---|---|---|
| Device | Mobility (cm²/Vs) | $I_{on}:I_{off}$ | Mobility (cm²/Vs) | $I_{on}:I_{off}$ | Variation (%) |
| A-1 | 0.06 | $10^5$-$10^6$ | 0.07 | $10^5$-$10^6$ | 16.7 |
| A-2 | 0.8 | $10^6$-$10^7$ | 0.9 | $10^6$-$10^7$ | 12.5 |
| A-3 | 0.6 | $10^6$-$10^7$ | 0.5 | $10^6$-$10^7$ | −16.7 |
| A-C4 | 0.001 | $10^3$-$10^4$ | 0.0002 | $10^2$-$10^3$ | −80.0 |
| A-C5 | 0.06 | $10^5$-$10^6$ | 0.02 | $10^4$-$10^5$ | −66.7 |
| A-C6 | 0.07 | $10^5$-$10^6$ | 0.02 | $10^4$-$10^5$ | −71.4 |
| A-C7 | 0.23 | $10^6$-$10^7$ | 0.04 | $10^5$-$10^6$ | −82.6 |
| A-C8 | 0.012 | $10^2$-$10^3$ | 0.0044 | $10^1$-$10^2$ | −63.3 |

TABLE 3

Device B Performance (Example 2)

| | Device B-2 | | | Device B-C5 | | |
|---|---|---|---|---|---|---|
| Channel Length (μm) | Mobility (cm²/Vs) | $I_{on}:I_{off}$ | Mobility Variation (%) | Mobility (cm²/Vs) | $I_{on}:I_{off}$ | Mobility Variation (%) |
| 50 | 0.45 | $10^6$-$10^7$ | 0 | 0.044 | $10^5$-$10^6$ | 0 |
| 20 | 0.42 | $10^7$-$10^8$ | −6.7 | 0.022 | $10^5$-$10^6$ | −50.0 |
| 10 | 0.36 | $10^7$-$10^8$ | −20.0 | 0.012 | $10^5$-$10^6$ | −72.3 |
| 5 | 0.24 | $10^7$-$10^8$ | −46.7 | 0.008 | $10^4$-$10^5$ | −81.8 |

| | Device B-1 | | | Device B-C6 | | |
|---|---|---|---|---|---|---|
| Channel Length (μm) | Mobility (cm²/Vs) | $I_{on}:I_{off}$ | Mobility Variation (%) | Mobility (cm²/Vs) | $I_{on}:I_{off}$ | Mobility Variation (%) |
| 50 | 0.050 | $10^4$-$10^5$ | 0 | 0.052 | $10^4$-$10^5$ | 0 |
| 20 | 0.046 | $10^4$-$10^5$ | −8.0 | 0.024 | $10^4$-$10^5$ | −53.8 |
| 10 | 0.040 | $10^4$-$10^5$ | −20.0 | 0.012 | $10^4$-$10^5$ | −76.9 |
| 5 | 0.029 | $10^4$-$10^5$ | −42.0 | 0.006 | $10^4$-$10^5$ | −88.5 |

TABLE 4

Device C Performance (Example 3)

| | Device C-2 | | | Device C-C5 | | |
|---|---|---|---|---|---|---|
| Channel Length (μm) | Mobility (cm$^2$/Vs) | $I_{on}:I_{off}$ | Mobility Variation (%) | Mobility (cm$^2$/Vs) | $I_{on}:I_{off}$ | Mobility Variation (%) |
| 50 | 1.2 | 10$^7$-10$^8$ | 0 | 0.15 | 10$^5$-10$^6$ | 0 |
| 20 | 1.1 | 10$^7$-10$^8$ | -8.3 | 0.08 | 10$^4$-10$^5$ | -46.7 |
| 10 | 0.95 | 10$^7$-10$^8$ | -20.8 | 0.03 | 10$^4$-10$^5$ | -80.0 |

| | Device C-3 | | | Device C-C7 | | |
|---|---|---|---|---|---|---|
| Channel Length (μm) | Mobility (cm$_2$/Vs) | $I_{on}:I_{off}$ | Mobility Variation (%) | Mobility (cm$^2$/Vs) | $I_{on}:I_{off}$ | Mobility Variation (%) |
| 50 | 2.5 | 10$^7$-10$^8$ | 0 | 0.43 | 10$^5$-10$^6$ | 0 |
| 20 | 2.0 | 10$^7$-10$^8$ | -20.0 | 0.21 | 10$^5$-10$^6$ | -51.2 |
| 10 | 1.3 | 10$^6$-10$^7$ | -48.0 | 0.08 | 10$^4$-10$^5$ | -81.4 |

TABLE 5

Device D Performance (Example 4)

| | Device | | | | | |
|---|---|---|---|---|---|---|
| | D-3-Au | | D-3-Ag | | | |
| Channel Length (μm) | Mobility (cm$^2$/Vs) | $I_{on}:I_{off}$ | Mobility (cm$^2$/Vs) | $I_{on}:I_{off}$ | Mobility (cm$^2$/Vs) | $I_{on}:I_{off}$ |
| 50 | 2.5 | 10$^7$-10$^8$ | 2.5 | 10$^7$-10$^8$ | 2.5 | 10$^7$-10$^8$ |
| 20 | 2.0 | 10$^7$-10$^8$ | 2.0 | 10$^7$-10$^8$ | 2.0 | 10$^7$-10$^8$ |
| 10 | 1.3 | 10$^6$-10$^7$ | 1.3 | 10$^6$-10$^7$ | 1.3 | 10$^6$-10$^7$ |

| | Device | | | | | |
|---|---|---|---|---|---|---|
| | D-C7-Au | | D-C7-Ag | | | |
| Channel Length (μm) | Mobility (cm$^2$/Vs) | $I_{on}:I_{off}$ | Mobility (cm$^2$/Vs) | $I_{on}:I_{off}$ | Mobility (cm$^2$/Vs) | $I_{on}:I_{off}$ |
| 50 | 0.43 | 10$^5$-10$^6$ | 0.43 | 10$^5$-10$^6$ | 0.43 | 10$^5$-10$^6$ |
| 20 | 0.21 | 10$^5$-10$^6$ | 0.21 | 10$^5$-10$^6$ | 0.21 | 10$^5$-10$^6$ |
| 10 | 0.08 | 10$^4$-10$^5$ | 0.08 | 10$^4$-10$^5$ | 0.08 | 10$^4$-10$^5$ |

TABLE 6

Device D Performance (Example 4)

| | Device | | | | | |
|---|---|---|---|---|---|---|
| | D-3-Cu | | D-3-Mo | | | |
| Channel Length (μm) | Mobility (cm$^2$/Vs) | $I_{on}:I_{off}$ | Mobility (cm$^2$/Vs) | $I_{on}:I_{off}$ | Mobility (cm$^2$/Vs) | $I_{on}:I_{off}$ |
| 50 | 1 | 10$^6$-10$^7$ | 1 | 10$^6$-10$^7$ | 1 | 10$^6$-10$^7$ |
| 20 | 0.75 | 10$^6$-10$^7$ | 0.75 | 10$^6$-10$^7$ | 0.75 | 10$^6$-10$^7$ |
| 10 | 0.51 | 10$^6$-10$^7$ | 0.51 | 10$^6$-10$^7$ | 0.51 | 10$^6$-10$^7$ |

| | Device | | | | | |
|---|---|---|---|---|---|---|
| | D-C7-Cu | | D-C7-Mo | | | |
| Channel Length (μm) | Mobility (cm$^2$/Vs) | $I_{on}:I_{off}$ | Mobility (cm$^2$/Vs) | $I_{on}:I_{off}$ | Mobility (cm$^2$/Vs) | $I_{on}:I_{off}$ |
| 50 | 0.15 | 10$^4$-10$^5$ | 0.15 | 10$^4$-10$^5$ | 0.15 | 10$^4$-10$^5$ |
| 20 | 0.06 | 10$^4$-10$^5$ | 0.06 | 10$^4$-10$^5$ | 0.06 | 10$^4$-10$^5$ |
| 10 | 0.02 | 10$^4$-10$^5$ | 0.02 | 10$^4$-10$^5$ | 0.02 | 10$^4$-10$^5$ |

TABLE 7

Device E Performance (Example 5)

| | Device | | | | | |
|---|---|---|---|---|---|---|
| | E-2-Grav | | | E-2-Ink | | |
| Channel Length (μm) | Mobility (cm$^2$/Vs) | $I_{on}:I_{off}$ | Mobility Variation (%) | Mobility (cm$^2$/Vs) | $I_{on}:I_{off}$ | Mobility Variation (%) |
| 50 | 1.0 | 10$^7$-10$^8$ | 0 | 0.60 | 10$^5$-10$^6$ | 0 |
| 20 | 0.97 | 10$^7$-10$^8$ | -3.0 | 0.56 | 10$^5$-10$^6$ | -6.7 |
| 10 | 0.89 | 10$^7$-10$^8$ | -11.0 | 0.50 | 10$^4$-10$^5$ | -16.7 |

| | Device | | | | | |
|---|---|---|---|---|---|---|
| | E-C5-Grav | | | E-C5-Ink | | |
| Channel Length (μm) | Mobility (cm$^2$/Vs) | $I_{on}:I_{off}$ | Mobility Variation (%) | Mobility (cm$^2$/Vs) | Ion:Ioff | Mobility Variation (%) |
| 50 | 0.034 | 10$^4$-10$^5$ | 0 | 0.052 | 10$^4$-10$^5$ | 0 |
| 20 | 0.018 | 10$^4$-10$^5$ | -47.1 | 0.034 | 10$^4$-10$^5$ | -34.6 |
| 10 | 0.009 | 103-104 | -73.5 | 0.018 | 10$^4$-10$^5$ | -65.4 |

TABLE 8

Device F Performance (Example 6)

| | Device F-2 | | | Device F-C7 | | |
|---|---|---|---|---|---|---|
| Channel Length (μm) | Mobility (cm$^2$/Vs) | $I_{on}:I_{off}$ | Mobility Variation (%) | Mobility (cm$^2$/Vs) | $I_{on}:I_{off}$ | Mobility Variation (%) |
| 50 | 1.2 | 10$^6$-10$^7$ | 0 | 0.40 | 10$^5$-10$^6$ | 0 |
| 10 | 1.0 | 10$^6$-10$^7$ | -16.7 | 0.14 | 10$^5$-10$^6$ | -65.0 |

TABLE 9

Device H Performance (Example 8)

| | Device H-2 | | |
|---|---|---|---|
| Channel Length (μm) | Mobility (cm$^2$/Vs) | $I_{on}:I_{off}$ | Mobility Variation (%) |
| 50 | 0.70 | 10$^5$-10$^6$ | 0 |
| 20 | 0.55 | 10$^4$-10$^5$ | -21.4 |

Notably, semiconductor materials 2 and 3 exhibit carrier mobilities significantly higher than those of comparative materials C4-C8. Importantly, performance of devices including semiconductor materials 1-3 remain substantial when the channel length is reduced from 50 μm to <20 μm, outperforming devices including comparative materials C4-C8, Thin-film transistors including materials 1-3 demonstrate excellent field-effect characteristics. Particularly, the results of Tables 2-9, above, and in FIGS. 6-16 and 18-19 demonstrate that short-channel thin-film transistors including semiconductor materials 1-3 exhibit carrier mobilities of at least 50% of the carrier mobilities of otherwise identical transistors having a longer channel length (e.g., 50 μm), whereas the carrier mobility of thin-film transistors including conventional n-type organic semiconductors degrades significantly as channel-length is reduced. Notably, this desirable performance is independent of dielectric material (see, e.g., Examples 1-3, 6), electrode material (see, e.g., Example 4), channel width (see, e.g., Examples 1, 6) and fabrication method (see, e.g., Examples 5, 8).

Figure 17:
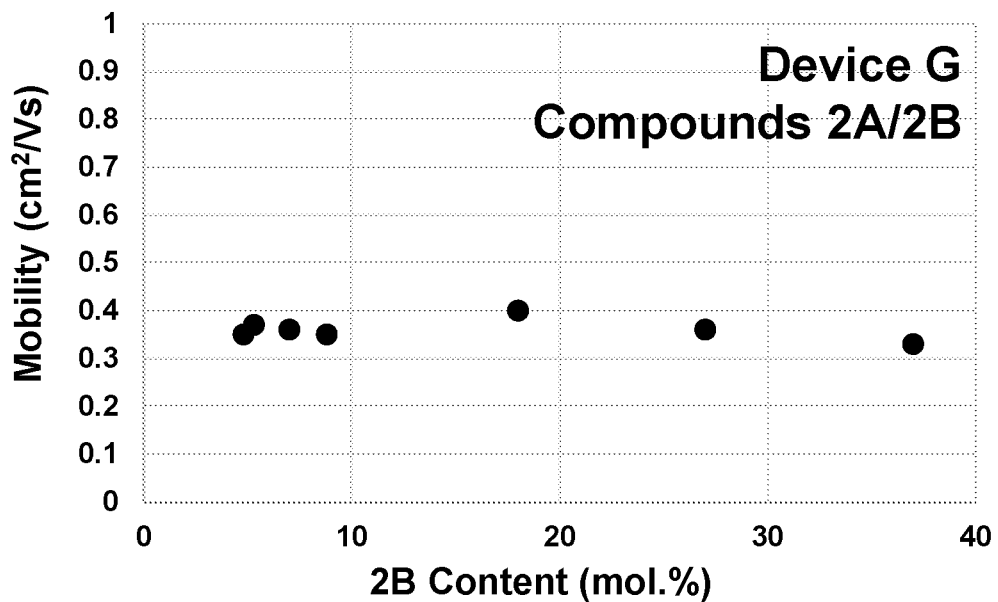
FIG. 17 is a set of graphs showing the carrier mobility variation between thin-film transistors including semiconductor materials having various isomeric ratios.
Figure 17:
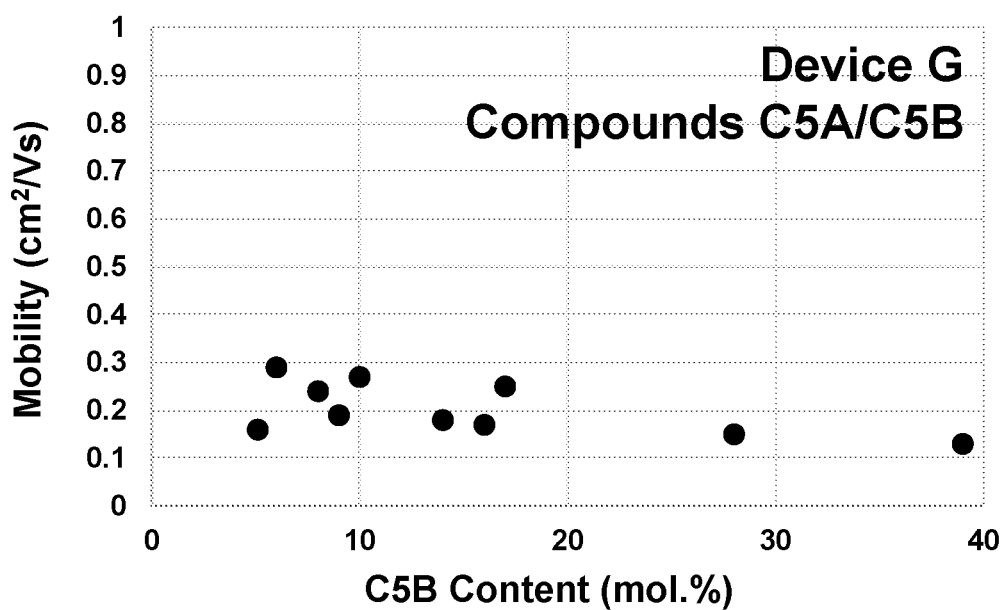
Figure 18:
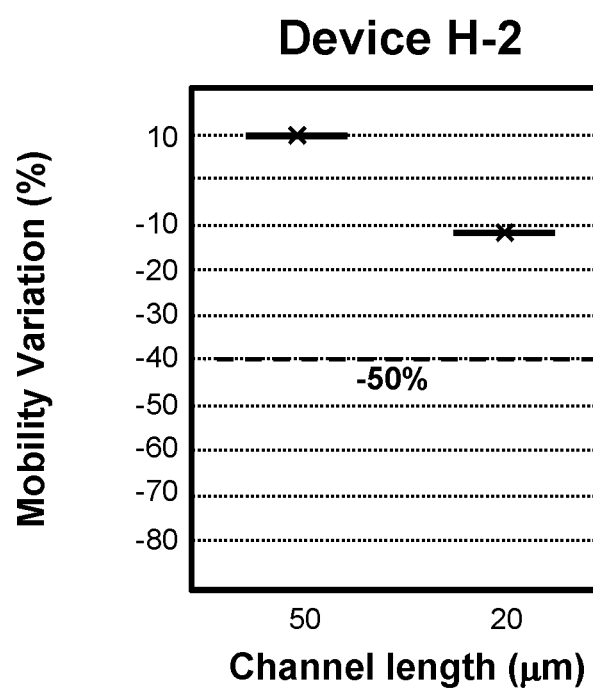
FIG. 18 is a graph showing the carrier mobility variation between thin-film transistors having channel lengths of 50 μm or 10 μm comprising an n-type organic semiconductor material described herein.
Figure 19:
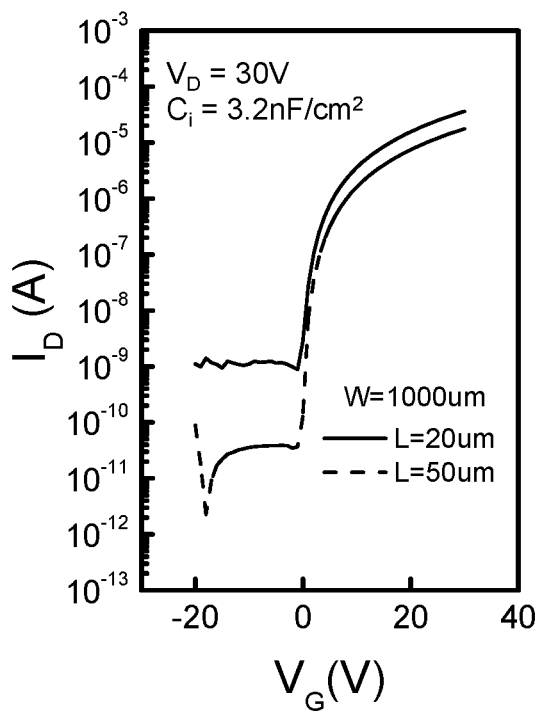
FIG. 19 is a set of graphs showing output characteristics for a thin-film transistor described herein.
Figure 19:
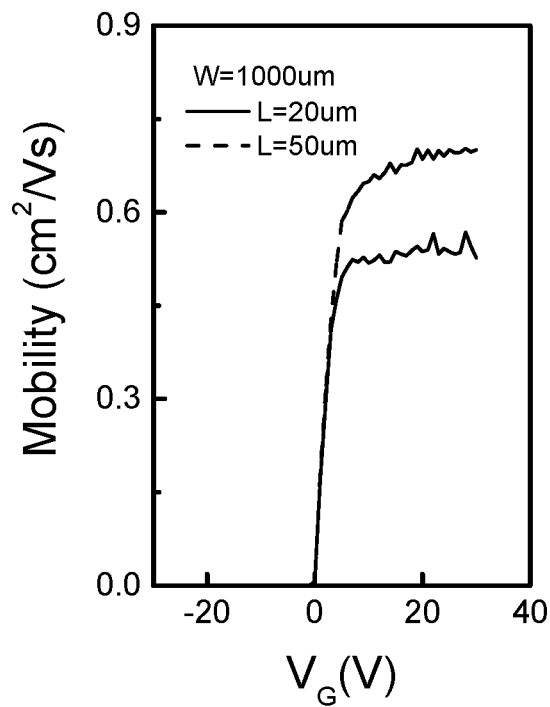

FIG. 17 shows the mobility performance of Devices G (Example 7) as a function of mol. % of the respective 1,6-isomer present in the semiconductor material of the device. The results demonstrate that carrier mobility is further independent of isomeric ratio.

The data demonstrate that the electron mobility only changes by a relatively minor amount when going from a 50 micron channel length to a 20 micron for compounds 1A, 1B, 2A, 2B, 3A and 3B. In contrast, similar compounds C4-C8 experience a dramatic reduction in electron mobility when going from 50 micron to 20 micron channel length. Accordingly, transistor devices having relatively short channel lengths (20 microns or less) made from compounds 1A, 1B, 2A, 2B, 3A and 3B as claimed are unexpectedly advantaged as compared very similar structures. This would not have been expected by the person of ordinary skill in the art, especially in view of the similarity of the molecular structures.

Various aspects of the invention are further described by the following numbered embodiments, which can be combined in any combination that is not technically or logically inconsistent;

Embodiment 1. A thin-film transistor comprising
  a dielectric layer having a first side and an opposed second side;
  a source electrode, a drain electrode separated from the source electrode, and a semiconductor component disposed between and in contact with the source electrode and the drain electrode, the source electrode, the drain electrode and the semiconductor component being disposed adjacent the first side of the dielectric layer; and
  a gate electrode disposed adjacent the second side of the dielectric layer opposite the semiconductor component;
wherein the semiconductor component comprises one or more compounds selected from the group consisting of;

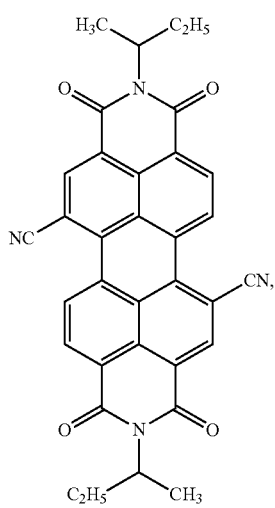

1A

-continued

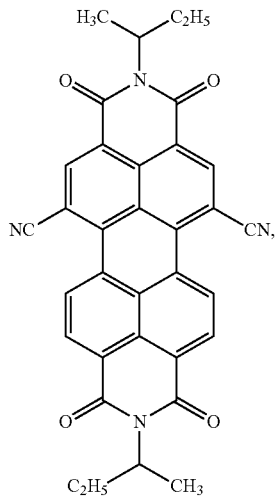

1B

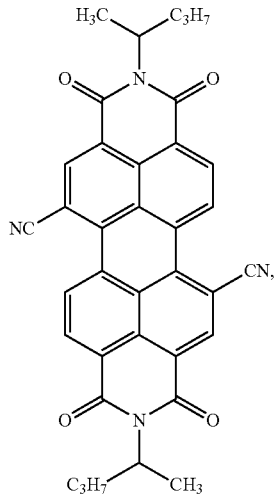

2A

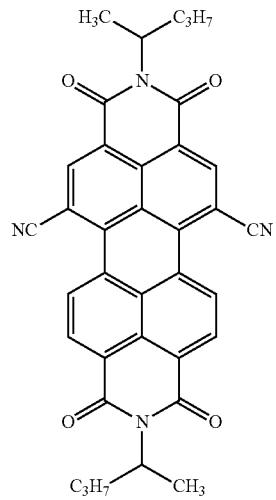

2B

-continued

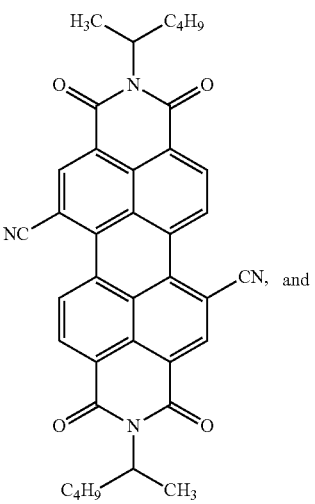

3A

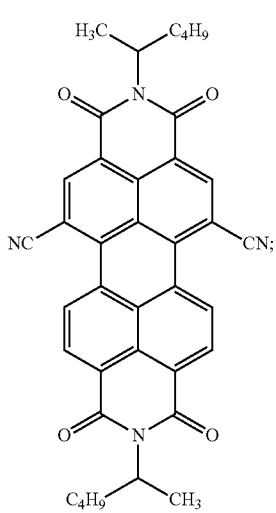

3B wherein the thin-film transistor has a channel length measured as the shortest path from the source electrode to the drain electrode, the channel length being no more than 20 μm.

Embodiment 2. The transistor of embodiment 1, wherein the one or more compounds are selected from:

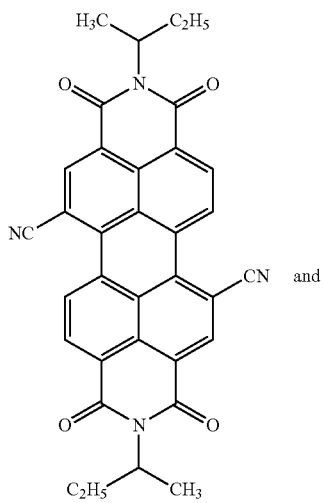

1A

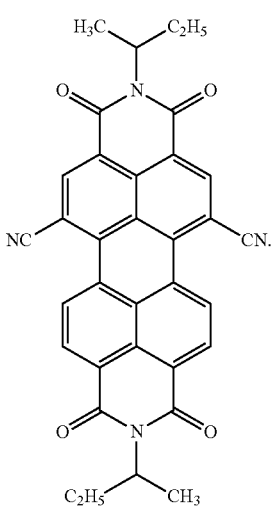

1B

Embodiment 3. The transistor of embodiment 2, wherein the molar ratio of compounds 1A and 1B (i.e., 1A:1B) is at least 2:1, e.g., at least 3:1, at least 3.5:1, at least 4:1, at least 4.5:1, at least 5:1 or at least 6:1.

Embodiment 4. The transistor of embodiment 2, wherein the molar ratio of compounds 1A and 1B is within the range of 2:1 to 50:1, e.g., in the range of 3:1 to 50:1, or 3.5:1 to 50:1, or 4:1 to 50:1, or 5:1 to 50:1, or 6:1 to 50:1, or 5:1 to 25:1, or 6:1 to 10:1.

Embodiment 5. The transistor of claim 1, wherein the one or more compounds are selected from:

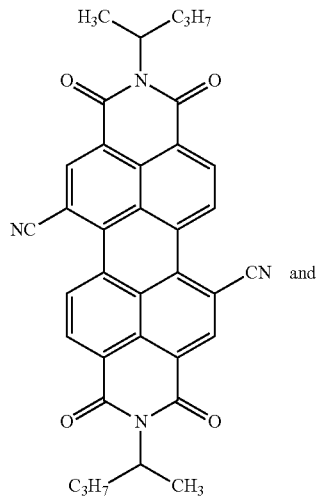

2A

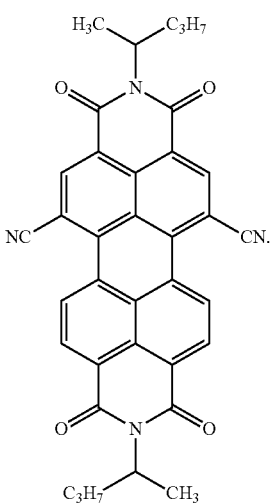

2B

Embodiment 6. The transistor of claim 5, wherein the molar ratio of compounds 2A and 2B (i.e., 2A:2B) is at least 2:1, e.g., at least 3:1, at least 3.5:1, at least 4:1, at least 4.5:1, at least 5:1 or at least 6:1.

Embodiment 7. The transistor of embodiment 5, wherein the molar ratio of compounds 2A and 2B is within the range of 2:1 to 50:1, e.g., in the range of 3:1 to 50:1, or 3.5:1 to 50:1, or 4:1 to 50:1, or 5:1 to 50:1, or 6:1 to 50:1, or 5:1 to 25:1, or 6:1 to 10:1.

Embodiment 8. The transistor of claim 1, wherein the one or more compounds are selected from:

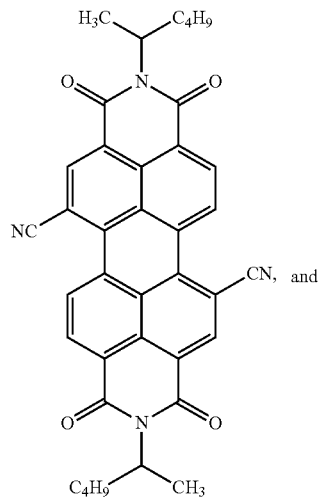

3A

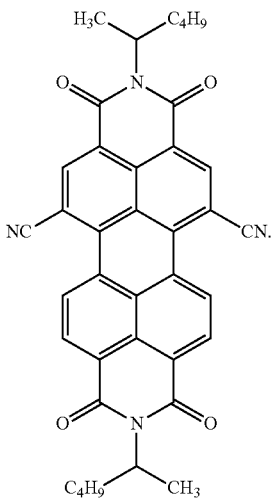

3B

Embodiment 9. The transistor of claim 8, wherein the molar ratio of compounds 3A and 3B (i.e., 3A:3B) is at least 2:1.

Embodiment 10. The transistor of embodiment 9, wherein the molar ratio of compounds 3A and 3B is within the range of 2:1 to 50:1, e.g., in the range of 3:1 to 50:1, or 3.5:1 to 50:1, or 4:1 to 50:1, or 5:1 to 50:1, or 6:1 to 50:1, or 5:1 to 25:1, or 6:1 to 10:1.

Embodiment 11. The transistor of any of embodiments 1-10, wherein the semiconductor component is formed from at least 75 wt. % of the one or more compounds, e.g., at least 80 wt. %, or at least 85 wt. %.

Embodiment 12, The transistor of any of embodiments 1-10, wherein the semiconductor component is formed from at least 90 wt. %, e.g., at least 95 wt. % or at least 98 wt. % of the one or more compounds.

Embodiment 13, The transistor of any of embodiments 1-10, wherein the semiconductor component is formed from at least 2% of the one or more compounds, e.g., at least 5%, at least 10%, at least 20% or at least 35%, for example, provided in a polymer matrix.

Embodiment 14. The transistor of any of embodiments 1-13, wherein the channel length is in the range of 3-20 µm e.g., in the range of 5-20 µm, or 8-20 µm, or 10-20 µm.

Embodiment 15. The transistor of any of embodiments 1-13, wherein the channel length is in no more than 18 µm, e.g., in the range of 3-18 µm, or 5-18 µm, or 8-18 µm, or 10-18 µm.

Embodiment 16. The transistor of any of embodiments 1-13, wherein the channel length is in no more than 15 µm, e.g., in the range of 3-15 µm, or 5-15 µm, or 8-15 µm, or 10-15 µm, Embodiment 17. The transistor of any of embodiments 1-13, wherein the channel length is in no more than 14 µm, e.g., in the range of 3-14 µm, or 5-14 µm, or 8-14 µm, or 10-14 µm.

Embodiment 18. The transistor of any of embodiments 1-13, wherein the channel length is in no more than 13 µm, e.g., in the range of 3-13 µm, or 5-13 µm, or 8-13 µm, or 10-13 µm.

Embodiment 19. The transistor of any of embodiments 1-13, wherein the channel length is in no more than 12 µm, e.g., in the range of 3-12 µm, or 5-12 µm, or 8-12 µm, or 10-12 µm.

Embodiment 20. The transistor of any of embodiments 1-13, wherein the channel length is no more than 10 µm, e.g., in the range of 3-10 µm, or 5-10 µm, or 8-10 µm, Embodiment 21. The transistor of any of embodiments 1-20, wherein the semiconductor component has a thickness within the range of 10 nm to 100 nm.

Embodiment 21. The transistor of any of embodiments 1-20, wherein the semiconductor component has a thickness within the range of 10 nm to 90 nm, or 10 nm to 80 nm, or 10 nm to 70 nm, or 10 nm to 60 nm, or 20 nm to 100 nm, or 30 nm to 100 nm, or 40 nm to 100 nm, or 20 nm to 90 nm, or 20 nm to 80 nm, or 20 nm to 70 nm, or 20 nm to 60 nm.

Embodiment 22. The transistor of any of embodiments 1-20, wherein the channel has a width perpendicular to the semiconductor component thickness and the channel length, the width being up to 4 mm, e.g., up to 3 mm, up to 2 mm, or up to 1 mm.

Embodiment 23. The transistor of any of embodiments 1-20, wherein the channel has a width perpendicular to the semiconductor component thickness and the channel length, the width being within the range of 0.01 mm to 4 mm, e.g., within the range of 0.01 mm to 3 mm, or 0.01 mm to 2 mm, or 0.01 mm to 1 mm, or 0.01 mm to 0.5 mm, or 0.01 mm to 0.3 mm, or 0.01 mm to 0.2 mm, or 0.01 mm to 0.15 mm, or 0.01 mm to 0.1 mm, or 0.015 mm to 4 mm, or 0,015 mm to 2 mm, or 0.015 mm to 1 mm, or 0.015 mm to 0.5 mm, or 0.015 mm to 0.2 mm, or 0.015 mm to 0.1 mm.

Embodiment 24. The transistor of any of embodiments 1-23, wherein each of the source electrode, drain electrode, and gate electrode independently comprises a gold layer, a silver layer, a copper layer, or a molybdenum layer.

Embodiment 25. The transistor of any of embodiments 1-24, wherein one or more of (e.g., each of) the source electrode, drain electrode, and gate electrode independently comprises a silver layer.

Embodiment 26. The transistor of any of embodiments 1-25, further comprising a substrate supporting the semiconductor component, the dielectric layer, the source electrode, the drain electrode and the gate electrode, Embodiment 27. The transistor of embodiment 25 or embodiment 26, wherein the substrate comprises a plastic (e.g., polyethylene naphthalate, polyether ether ketone, or polyimide) layer or a glass layer.

Embodiment 28. The transistor of any of embodiments 1-17, wherein each of the source electrode, drain electrode, and gate electrode independently has a thickness in the direction of the semiconductor component thickness within the range of 30 nm to 500 nm.

Embodiment 29, The transistor of any of embodiments 1-18, wherein the dielectric layer has a dielectric constant in the range of 2.5-25, e.g., in the range of 2.5-15, 2.5-10, or 2.5-7, or 4-25, or 4-15, or 4-10, or 4-7, Embodiment 30. The transistor of any of embodiments 1-29, wherein the sheet capacitance of the dielectric layer is within the range of 3 $nF/cm^2$ to 30 $nF/cm^2$.

Embodiment 31. The transistor of any of embodiments 1-30, having a carrier mobility that is at least 50% of a carrier mobility of an otherwise identical transistor having a channel length of 50 µm.

Embodiment 32. The transistor of any of embodiments 1-30, having a carrier mobility that is at least 65% of a carrier mobility of an otherwise identical transistor having a channel length of 50 µm.

The invention claimed is:

1. A thin-film transistor comprising
a dielectric layer having a first side and a second side opposed to said first side;
a source electrode, a drain electrode separated from the source electrode, and a semiconductor component disposed between and in contact with said source electrode and said drain electrode, said source electrode, said drain electrode and said semiconductor component being disposed adjacent the first side of said dielectric layer; and
a gate electrode disposed adjacent the said second side of the dielectric layer opposite said semiconductor component;

wherein the semiconductor component comprises one or more of the following pairs of compounds:

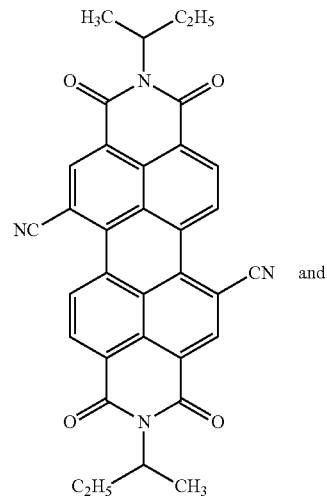

1A

-continued

1B
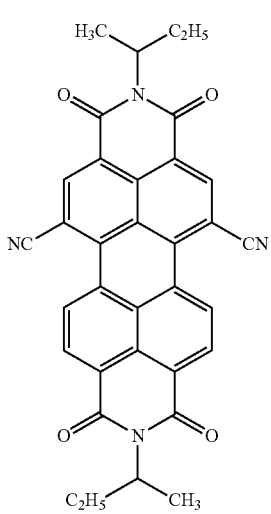

in a molar ratio of compounds 1A to 1B in the range of 3:1 to 50:1,

2A
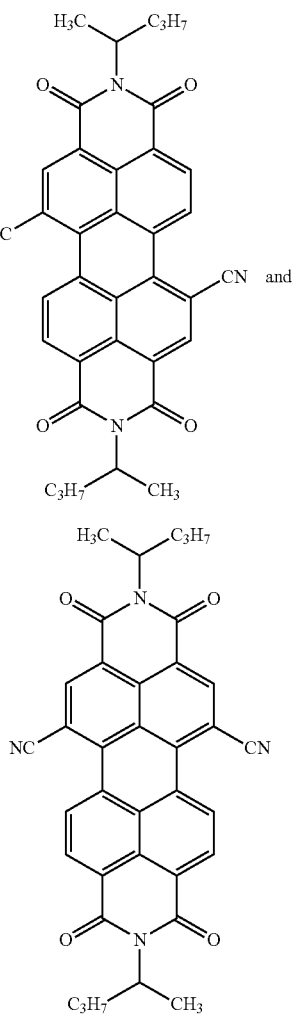

2B in a molar ratio of compounds 2A to 2B in the range of 3:1 to 50:1, and

3A
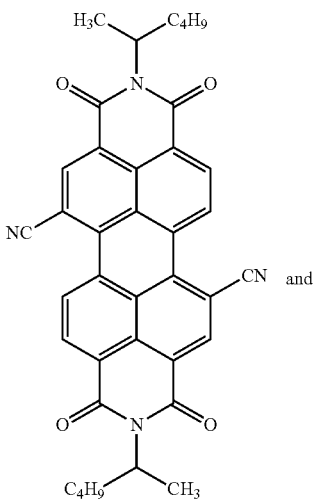

and

3B
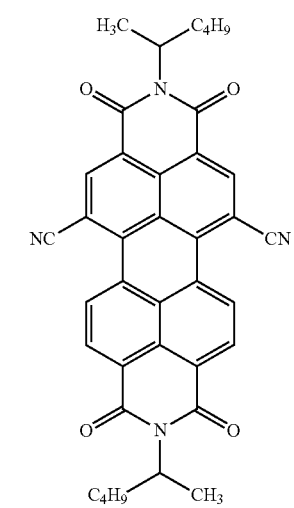

in a molar ratio of compounds 3A to 3B in the range of 3:1 to 50:1;

wherein said thin-film transistor has a channel length in the range of 3-20 μm, said channel length being measured as the shortest path from the source electrode to the drain electrode.

2. The transistor of claim 1, wherein the semiconductor component

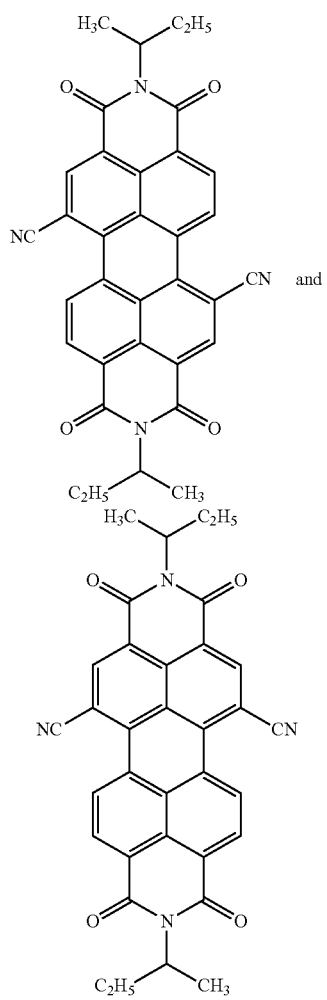
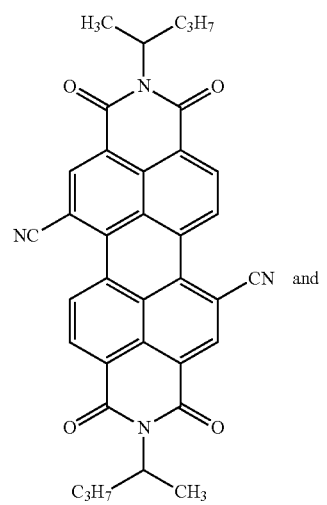
in a molar ratio of compounds 1A to 1B in the range of 3:1 to 50:1.
3. The transistor of claim 1, wherein the semiconductor component comprises
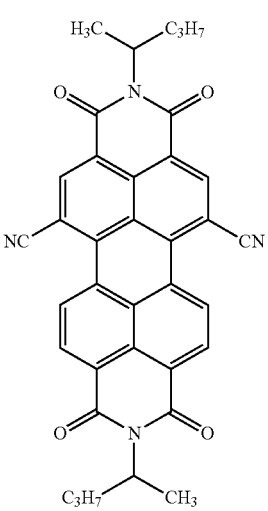
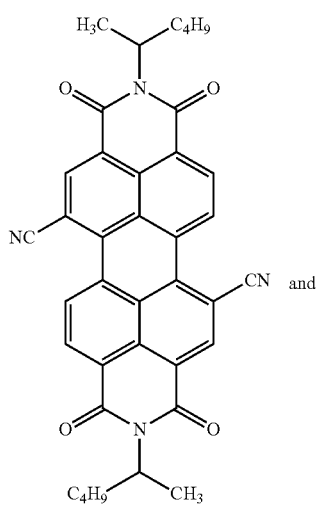
in a molar ratio of compounds 2A to 2B in the range of 3:1 to 50:1.
4. The transistor of claim 1, wherein the semiconductor component
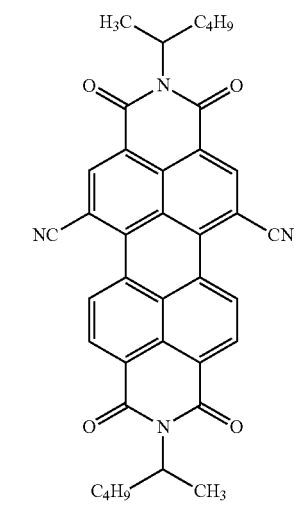

in a molar ratio of compounds 3A to 3B in the range of 3:1 to 50:1.

5. The transistor of claim 1, wherein said semiconductor component is formed from at least 75 wt. % of the one or more pairs of compounds.

6. The transistor of claim 1, wherein said channel length is in the range of 3-18 μm.

7. The transistor of claim 1, wherein said channel length is no more than 10 μm.

8. The transistor of claim 1, wherein said semiconductor component has a thickness within the range of 10 nm to 100 nm.

9. The transistor of claim 1, wherein said channel has a width perpendicular to the semiconductor component thickness and to the channel length, said width being within the range of 0.01 mm to 4 mm.

10. The transistor of claim 1, wherein each of said source electrode, drain electrode, and gate electrode independently comprises a gold layer, a silver layer, a copper layer, or a molybdenum layer.

11. The transistor of claim 1, wherein one or more of said source electrode, drain electrode, and gate electrode independently comprises a silver layer.

12. The transistor of claim 1, further comprising a substrate supporting said semiconductor component, said dielectric layer, said source electrode, said drain electrode and said gate electrode.

13. The transistor of claim 1, wherein each of said source electrode, drain electrode, and gate electrode independently has a thickness in the direction of the semiconductor component thickness within the range of 30 nm to 500 nm.

14. The transistor of claim 1, wherein said dielectric layer has a dielectric constant in the range of 2.5-25.

15. The transistor of claim 1, having a carrier mobility that is at least 50% of a carrier mobility of an otherwise identical transistor having a channel length of 50 μm.

16. The transistor of claim 1, wherein
said semiconductor component has a thickness within the range of 10 nm to 100 nm; and
said channel has a width perpendicular to the semiconductor component thickness and to the channel length, said width being within the range of 0.01 mm to 4 mm.

17. The transistor of claim 16,
wherein each of said source electrode, drain electrode, and gate electrode independently comprises a gold layer, a silver layer, a copper layer, or a molybdenum layer; and
wherein each of said source electrode, drain electrode, and gate electrode independently has a thickness in the direction of the semiconductor component thickness within the range of 30 nm to 500 nm.

18. The transistor of claim 17 wherein one or more of said source electrode, drain electrode, and gate electrode independently comprises a silver layer.

19. The transistor of claim 1, wherein said channel length is in the range of 5-15 μm.

20. The transistor of claim 1, having a carrier mobility that is at least 55% of a carrier mobility of an otherwise identical transistor having a channel length of 50 μm.

21. The transistor of claim 12, wherein the substrate is a polyethylene naphthalate substrate.

22. The transistor of claim 1, wherein each of the ratios is in a range of 3.5:1 to 25:1.

* * * * *